US012707650B2

(12) United States Patent
Yu et al.

(10) Patent No.: US 12,707,650 B2
(45) Date of Patent: Aug. 11, 2026

(54) PACKAGE STRUCTURE AND METHOD FOR FORMING THE SAME

(71) Applicant: Taiwan Semiconductor Manufacturing Company, Ltd., Hsinchu (TW)

(72) Inventors: Chen-Hua Yu, Hsinchu City (TW); Tung-Liang Shao, Hsinchu City (TW); Yu-Sheng Huang, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 568 days.

(21) Appl. No.: 18/318,202

(22) Filed: May 16, 2023

(65) Prior Publication Data

US 2024/0389363 A1 Nov. 21, 2024

(51) Int. Cl.

| | |
|---|---|
| ***H10B 80/00*** | (2026.01) |
| ***H01L 21/56*** | (2006.01) |
| ***H01L 21/683*** | (2006.01) |
| ***H10P 72/70*** | (2026.01) |
| ***H10W 70/60*** | (2026.01) |
| ***H10W 70/65*** | (2026.01) |

(Continued)

(52) U.S. Cl.
CPC ......... *H10B 80/00* (2023.02); *H10P 72/7402* (2026.01); *H10W 70/611* (2026.01); *H10W 70/65* (2026.01); *H10W 74/01* (2026.01); *H10W 90/00* (2026.01); *H10W 72/07252* (2026.01); *H10W 72/221* (2026.01); *H10W 72/856* (2026.01); *H10W 72/932* (2026.01)

(58) Field of Classification Search
CPC ........ H10B 80/00; H10B 10/00; H10B 12/00; H10B 41/20; H10D 88/00; H10D 88/013; H10D 88/015; H10D 89/105; H10D 89/60; H01L 2224/95; H01L 2224/97; H01L 2994/143
See application file for complete search history.

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

CN 111244052 A 6/2020
CN 115527987 A 12/2022
TW 201532326 A 8/2015

OTHER PUBLICATIONS

Chinese language office action dated Sep. 25, 2024, issued in application No. TW 112125925.

*Primary Examiner* — Lawrence C Tynes, Jr.
(74) *Attorney, Agent, or Firm* — McClure, Qualey & Rodack, LLP

(57) ABSTRACT

A package structure is provided. The package structure includes a cell chip structure having a memory cell and a multiplexer. The package structure includes an intermediate chip structure directly bonded to the cell chip structure through dielectric-to-dielectric bonding and metal-to-metal bonding and having a sense amplifier and a driver element. The intermediate chip structure does not have a memory cell. The package structure includes a calculating chip structure bonded to the intermediate chip structure and having a calculating element.

20 Claims, 16 Drawing Sheets

(51) Int. Cl.

| | |
|---|---|
| ***H10W 74/01*** | (2026.01) |
| ***H10W 90/00*** | (2026.01) |
| *H10W 72/00* | (2026.01) |
| *H10W 72/20* | (2026.01) |
| *H10W 72/90* | (2026.01) |

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,373,686 | B2 | 8/2019 | Tran | |
| 11,672,111 | B2 * | 6/2023 | Chen | H01L 23/5226 257/621 |
| 12,027,475 | B2 | 7/2024 | Chang | |
| 12,027,513 | B2 | 7/2024 | Chang | |
| 2021/0247910 | A1 * | 8/2021 | Kim | G06F 3/0631 |
| 2022/0223530 | A1 | 7/2022 | Yu | |
| 2024/0113078 | A1 * | 4/2024 | Noguchi | H10W 90/00 |
| 2024/0311006 | A1 * | 9/2024 | Mathuriya | G06F 3/061 |

* cited by examiner

PACKAGE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes continue to decrease, fabrication processes continue to become more difficult to perform. Therefore, it is a challenge to form reliable packages with electronic components with high integration density.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
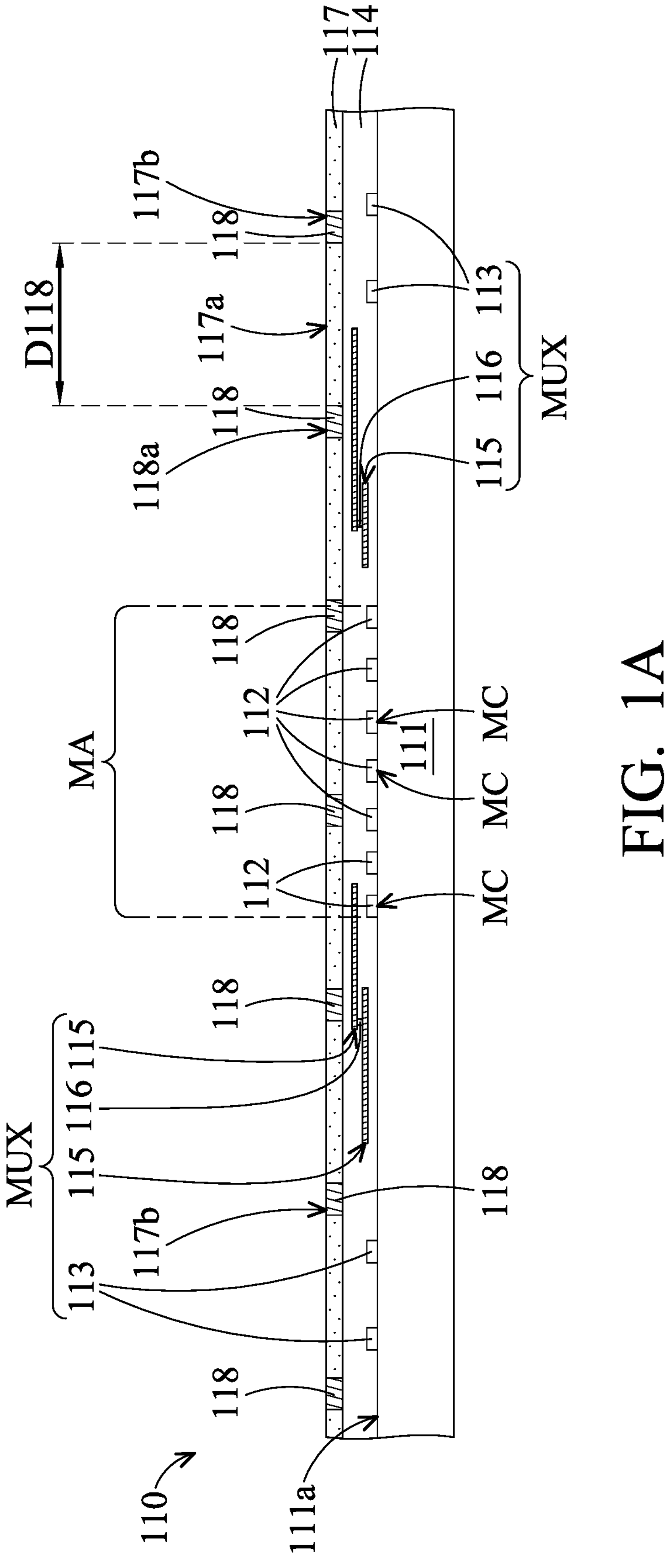
FIGS. 1A-1F are cross-sectional views of various stages of a process for forming a package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are cross-sectional views of various stages of a process for forming a package structure, in accordance with some embodiments. As shown in FIG. 1A, a cell chip structure 110 is provided, in accordance with some embodiments. The cell chip structure 110 is also referred to as a chip-containing structure, in accordance with some embodiments. The cell chip structure 110 has a substrate 111, device elements 112 and 113, a dielectric structure 114, wiring layers 115, conductive vias 116, a thermal conductive layer 117, and bonding pads 118, in accordance with some embodiments.

The substrate 111 includes, for example, a semiconductor substrate. The substrate 111 includes, for example, a semiconductor wafer (such as a silicon wafer) or a portion of a semiconductor wafer. In some embodiments, the substrate 111 is made of an elementary semiconductor material including silicon or germanium in a single crystal structure, a polycrystal structure, or an amorphous structure.

In some other embodiments, the substrate 111 is made of a compound semiconductor, such as silicon carbide, gallium arsenide, gallium phosphide, indium phosphide, indium arsenide, an alloy semiconductor, such as SiGe or GaAsP, or a combination thereof. The substrate 111 may also include multi-layer semiconductors, semiconductor on insulator (SOI) (such as silicon on insulator or germanium on insulator), or a combination thereof.

In some embodiments, the device elements 112 and 113 are formed in and/or over the substrate 111. Examples of the device elements 112 and 113 include active devices, passive devices, other suitable elements, or a combination thereof. The active devices may include transistors or diodes (not shown) formed at a front surface 111*a* of the substrate 111. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 111. The isolation features are used to surround active regions and electrically isolate various device elements formed in and/or over the substrate 111 in the active regions. In some embodiments, the isolation features include shallow trench isolation (STI) features, local oxidation of silicon (LOCOS) features, other suitable isolation features, or a combination thereof.

The dielectric structure 114 is formed over the substrate 111, in accordance with some embodiments. The dielectric structure 114 covers the device elements 112 and 113, in accordance with some embodiments. The dielectric structure 114 includes dielectric layers, in accordance with some embodiments. The wiring layers 115 and the conductive vias 116 are formed in the dielectric structure 114, in accordance with some embodiments. The number of the wiring layers 115 ranges from about 3 to about 5, in accordance with some embodiments.

The thermal conductive layer 117 and the bonding pads 118 are formed over the dielectric structure 114, in accordance with some embodiments. The thermal conductive layer 117 surrounds the bonding pads 118, in accordance with some embodiments.

In some embodiments, a top surface 117*a* of the thermal conductive layer 117 and top surfaces 118*a* of the bonding pads 118 are substantially coplanar. The conductive vias 116 are electrically connected between the wiring layers 115, the device elements 112 and 113, and the bonding pads 118, in accordance with some embodiments.

In some embodiments, the device elements 112 includes transistors (and capacitors), and the device elements 112 together form memory cells MC. In some embodiments, the memory cells MC together form a memory cell array MA, in accordance with some embodiments.

In some embodiments, the device elements 113 includes transistors, and the device elements 113, a portion of the wiring layers 115, and the conductive vias 116 electrically connected to the device elements 113 together form a multiplexer MUX, in accordance with some embodiments. The memory cell array MA is electrically connected to the multiplexer MUX, in accordance with some embodiments. The dielectric structure 114 covers the memory cells MC and the multiplexer MUX, in accordance with some embodiments.

The multiplexer MUX is used to provide a "many-to-one" connection between the memory cells MC to a single circuit, in accordance with some embodiments. The memory cell array MA is electrically connected to the bonding pads 118 through the multiplexer MUX, in accordance with some embodiments. Therefore, the distance D118 between the bonding pads 118 is not limited by the small pitch of the memory cells MC (e.g., about 0.1 μm), in accordance with some embodiments.

As a result, the distance D118 is increased by the multiplexer MUX, which reduces the difficulty of a subsequent bonding process, in accordance with some embodiments. The distance D118 ranges from about 0.3 μm to about 0.6 μm, in accordance with some embodiments.

The dielectric structure 114 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric structure 114 includes a low-k material or a porous dielectric material having a k-value which is lower than that of silicon oxide, or lower than about 3.0 or about 2.5, in accordance with some embodiments.

The dielectric structure 114 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The wiring layers 115, the conductive vias 116, and the bonding pads 118 are made of a conductive material, such as metal (e.g., copper, aluminum, gold, silver, or tungsten) or alloys thereof, in accordance with some embodiments.

The thermal conductive layer 117 has a thermal conductivity higher than that of the dielectric structure 114, in accordance with some embodiments. The thermal conductive layer 117 is made of a dielectric material, in accordance with some embodiments. The dielectric material includes a nitride material such as aluminum nitride (AlN) or boron nitride (BN), a carbon-containing material such as diamond, or another suitable high thermal conductivity dielectric material with a thermal conductivity higher than that of silicon oxide, in accordance with some embodiments.

The formation of the thermal conductive layer 117 and the bonding pads 118 includes depositing the thermal conductive layer 117 over the dielectric structure 114; partially removing the thermal conductive layer 117 to form openings 117*b* in the thermal conductive layer 117; and forming the bonding pads 118 in the openings 117*b*, in accordance with some embodiments.

The thermal conductive layer 117 is formed using a chemical vapor deposition (CVD) process, such as a low-pressure CVD process, a plasma-enhanced CVD process, or a high-density plasma CVD process, an atomic layer deposition process, a physical vapor deposition process, or another suitable process.

Figure 1B:
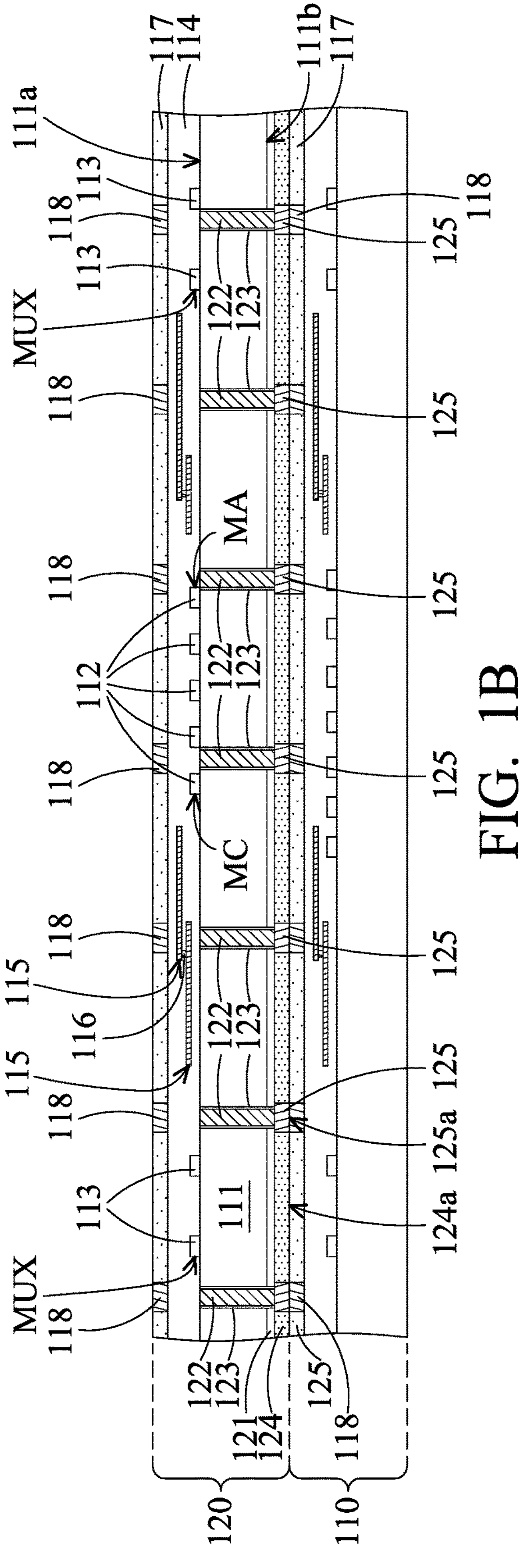

As shown in FIG. 1B, a cell chip structure 120 is bonded to the cell chip structure 110, in accordance with some embodiments. The cell chip structure 120 is similar to the cell chip structure 110, except that the cell chip structure 120 further has a dielectric layer 121, conductive via structures 122, an insulating layer 123, a thermal conductive layer 124, and bonding pads 125, in accordance with some embodiments.

The dielectric layer 121 is formed under a back surface 111*b* of the substrate 111 of the cell chip structure 120, in accordance with some embodiments. The dielectric layer 121 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric layer 121 includes a low-k material or a porous dielectric material having a k-value which is lower than that of silicon oxide, or lower than about 3.0 or about 2.5, in accordance with some embodiments.

The dielectric layer 121 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The conductive via structures 122 pass through the substrate 111 and the dielectric layer 121, in accordance with some embodiments. The insulating layer 123 is between the conductive via structures 122 and the substrate 111 and between the conductive via structures 122 and the dielectric layer 121, in accordance with some embodiments.

The insulating layer 123 is used to electrically insulate (or separate) the conductive via structures 122 from the substrate 111, in accordance with some embodiments. The insulating layer 123 continuously and laterally surrounds each conductive via structure 122, in accordance with some embodiments.

The conductive via structures 122 are made of a conductive material, such as metal (e.g., copper, aluminum, gold, silver, or tungsten) or alloys thereof, in accordance with some embodiments. The insulating layer 123 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the insulating layer 123 includes a low-k material or a porous dielectric material having a k-value which is lower than that of silicon oxide, or lower than about 3.0 or about 2.5, in accordance with some embodiments.

The thermal conductive layer 124 and the bonding pads 125 are formed under the dielectric layer 121, the conductive via structures 122, and the insulating layer 123, in accordance with some embodiments. The thermal conductive layer 124 surrounds the bonding pads 125, in accordance with some embodiments.

In some embodiments, a bottom surface **124*a* of the thermal conductive layer 124 and bottom surfaces 125*a* of the bonding pads 125 are substantially coplanar. As shown in FIG. 1B, the bottom surface 124*a* of the thermal conductive layer 124 and the bottom surfaces 125*a* of the bonding pads 125 are substantially leveled, in accordance with some embodiments. The conductive via structures 122 are electrically connected to the corresponding bonding pads 125**, in accordance with some embodiments.

The cell chip structure 120 is bonded to the cell chip structure 110 through dielectric-to-dielectric bonding and metal-to-metal bonding, in accordance with some embodiments. For example, the thermal conductive layer 124 is directly bonded to the thermal conductive layer 117 of the cell chip structure 110 while the cell chip structure 120 is bonded to the cell chip structure 110, in accordance with some embodiments. The bonding pads 125 are directly bonded to the bonding pads 118 of the cell chip structure 110 while the cell chip structure 120 is bonded to the cell chip structure 110, in accordance with some embodiments.

The thermal conductive layer 124 has a thermal conductivity higher than that of the dielectric structure 114 or the dielectric layer 121, in accordance with some embodiments. The thermal conductive layer 124 is made of a dielectric material, in accordance with some embodiments. The dielectric material includes a nitride material such as aluminum nitride (AlN) or boron nitride (BN), a carbon-containing material such as diamond, or another suitable high thermal conductivity dielectric material with a thermal conductivity higher than that of silicon oxide, in accordance with some embodiments.

The thermal conductive layer 124 is formed using a chemical vapor deposition (CVD) process, such as a low-pressure CVD process, a plasma-enhanced CVD process, or a high-density plasma CVD process, an atomic layer deposition process, a physical vapor deposition process, or another suitable process.

The bonding pads 125 are made of a conductive material, such as metal (e.g., copper, aluminum, gold, silver, or tungsten) or alloys thereof, in accordance with some embodiments.

Figure 1C:
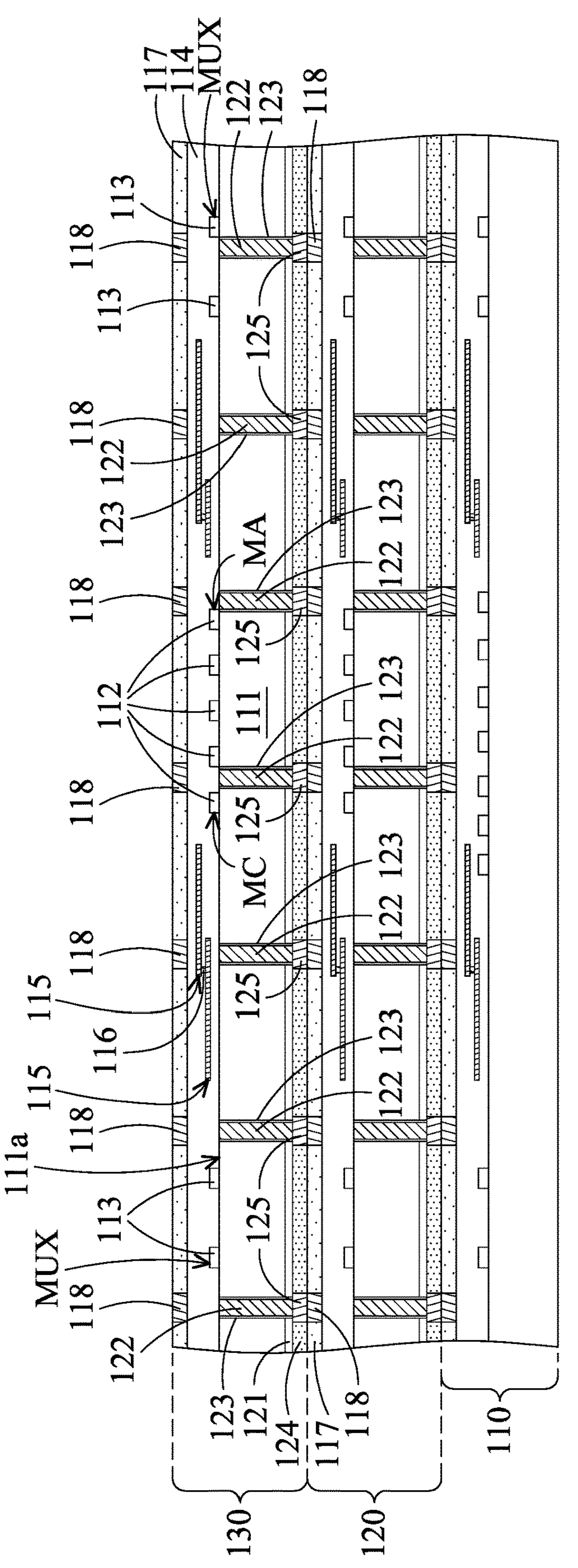

As shown in FIG. 1C, a cell chip structure 130 is bonded to the cell chip structure 120, in accordance with some embodiments. The cell chip structure 130 is similar to the cell chip structure 120, in accordance with some embodiments. The cell chip structure 130 is bonded to the cell chip structure 120 through dielectric-to-dielectric bonding and metal-to-metal bonding, in accordance with some embodiments.

For example, the thermal conductive layer 124 of the cell chip structure 130 is directly bonded to the thermal conductive layer 117 of the cell chip structure 120 while the cell chip structure 130 is bonded to the cell chip structure 120, in accordance with some embodiments. The bonding pads 125 of the cell chip structure 130 are directly bonded to the bonding pads 118 of the cell chip structure 120 while the cell chip structure 130 is bonded to the cell chip structure 120, in accordance with some embodiments.

Figure 1D:
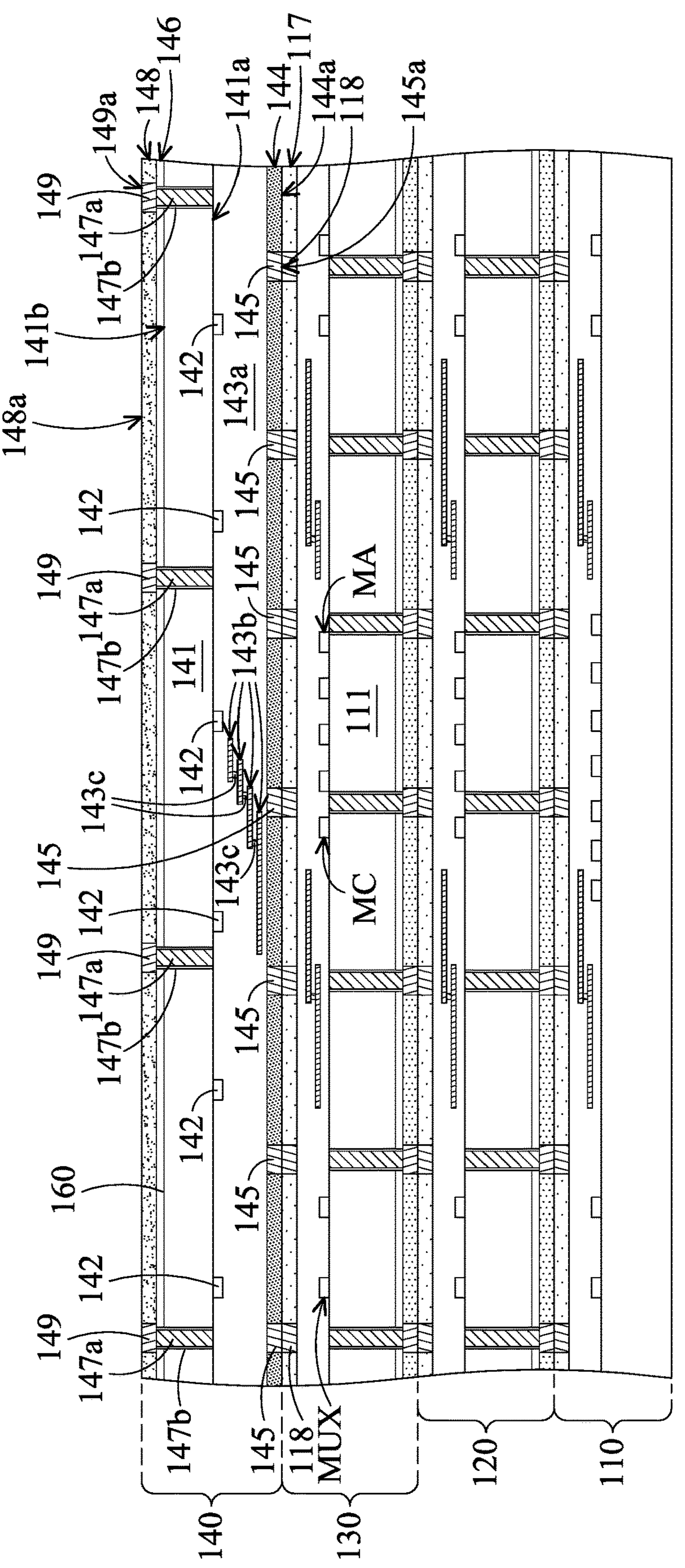

As shown in FIG. 1D, an intermediate chip structure 140 is bonded to the cell chip structure 130 through dielectric-to-dielectric bonding and metal-to-metal bonding, in accordance with some embodiments. The intermediate chip structure 140 is also referred to as a chip-containing structure, in accordance with some embodiments.

The intermediate chip structure 140 has a substrate 141, device elements 142, a dielectric structure **143*a*, wiring layers 143*b*, conductive vias 143*c*, a thermal conductive layer 144, bonding pads 145, a dielectric layer 146, conductive via structures 147*a*, an insulating layer 147*b*, a thermal conductive layer 148, and bonding pads 149**, in accordance with some embodiments.

The substrate 141 includes, for example, a semiconductor substrate. The substrate 141 includes, for example, a semiconductor wafer (such as a silicon wafer) or a portion of a semiconductor wafer. In some embodiments, the substrate 141 is made of an elementary semiconductor material including silicon or germanium in a single crystal structure, a polycrystal structure, or an amorphous structure.

In some other embodiments, the substrate 141 is made of a compound semiconductor, such as silicon carbide, gallium arsenide, gallium phosphide, indium phosphide, indium arsenide, an alloy semiconductor, such as SiGe or GaAsP, or a combination thereof. The substrate 141 may also include multi-layer semiconductors, semiconductor on insulator (SOI) (such as silicon on insulator or germanium on insulator), or a combination thereof.

In some embodiments, the device elements 142 are formed in and/or over the substrate 141. The device elements 142 include sense amplifiers (SA) and/or driver elements, in accordance with some embodiments. The driver elements include word line drivers, in accordance with some embodiments.

The intermediate chip structure 140 does not have memory cells and a multiplexer, in accordance with some embodiments. The cell chip structures 110, 120 and 130 do not have sense amplifiers and/or driver elements, in accordance with some embodiments.

The memory cells MC and the multiplexer MUX of the cell chip structure 130 and the device elements 142 are between the substrate 111 of the cell chip structure 130 and the substrate 141 of the intermediate chip structure 140, in accordance with some embodiments.

In some embodiments, the device elements 142 include active devices, passive devices, other suitable elements, or a combination thereof. The active devices may include transistors or diodes (not shown) formed at a front surface 141*a* of the substrate 141. The front surface 141*a* faces the cell chip structure 130, in accordance with some embodiments. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 141. The isolation features are used to surround active regions and electrically isolate various device elements formed in and/or over the substrate 141 in the active regions. In some embodiments, the isolation features include shallow trench isolation (STI) features, local oxidation of silicon (LOCOS) features, other suitable isolation features, or a combination thereof.

The dielectric structure 143*a* is formed under the substrate 141, in accordance with some embodiments. The dielectric structure 143*a* covers the device elements 142, in accordance with some embodiments. The dielectric structure 143*a* includes dielectric layers, in accordance with some embodiments. The wiring layers 143*b* and the conductive vias 143*c* are formed in the dielectric structure 143*a*, in accordance with some embodiments. The number of the wiring layers 143*b* ranges from about 5 to about 7, in accordance with some embodiments.

The thermal conductive layer 144 and the bonding pads 145 are formed under the dielectric structure 143*a*, in accordance with some embodiments. The thermal conductive layer 144 surrounds the bonding pads 145, in accordance with some embodiments.

In some embodiments, a bottom surface 144*a* of the thermal conductive layer 144 and bottom surfaces 145*a* of the bonding pads 145 are substantially coplanar. The conductive vias 143*c* are electrically connected between the wiring layers 143*b*, the device elements 142, and the bonding pads 145, in accordance with some embodiments.

The thermal conductive layer 144 is directly bonded to the thermal conductive layer 117 of the cell chip structure 130 while the intermediate chip structure 140 is bonded to the cell chip structure 130, in accordance with some embodiments. The bonding pads 145 are directly bonded to the bonding pads 118 of the cell chip structure 130 while the intermediate chip structure 140 is bonded to the cell chip structure 130, in accordance with some embodiments.

The dielectric structure 143*a* is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric structure 143*a* includes a low-k material or a porous dielectric material having a k-value which is lower than that of silicon oxide, or lower than about 3.0 or about 2.5, in accordance with some embodiments.

The dielectric structure 143*a* is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The wiring layers 143*b*, the conductive vias 143*c*, and the bonding pads 145 are made of a conductive material, such as metal (e.g., copper, aluminum, gold, silver, or tungsten) or alloys thereof, in accordance with some embodiments.

The thermal conductive layer 144 has a thermal conductivity higher than that of the dielectric structure 143*a*, in accordance with some embodiments. The thermal conductive layer 144 is made of a dielectric material, in accordance with some embodiments. The dielectric material includes a nitride material such as aluminum nitride (AlN) or boron nitride (BN), a carbon-containing material such as diamond, or another suitable high thermal conductivity dielectric material with a thermal conductivity higher than that of silicon oxide, in accordance with some embodiments.

The thermal conductive layer 144 is formed using a chemical vapor deposition (CVD) process, such as a low-pressure CVD process, a plasma-enhanced CVD process, or a high-density plasma CVD process, an atomic layer deposition process, a physical vapor deposition process, or another suitable process.

The dielectric layer 146 is formed over a back surface 141*b* of the substrate 141, in accordance with some embodiments. The dielectric layer 146 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 146 includes a low-k material or a porous dielectric material having a k-value which is lower than that of silicon oxide, or lower than about 3.0 or about 2.5, in accordance with some embodiments.

The dielectric layer 146 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The conductive via structures 147*a* pass through the substrate 141 and the dielectric layer 146, in accordance with some embodiments. The insulating layer 147*b* is between the conductive via structures 147*a* and the substrate 141 and between the conductive via structures 147*a* and the dielectric layer 146, in accordance with some embodiments. The insulating layer 147*b* is used to electrically insulate (or separate) the conductive via structures 147*a* from the substrate 141, in accordance with some embodiments.

The insulating layer 147*b* continuously surrounds each conductive via structure 147*a*, in accordance with some embodiments. The conductive via structures 147*a* are made of a conductive material, such as metal (e.g., copper, aluminum, gold, silver, or tungsten) or alloys thereof, in accordance with some embodiments.

The insulating layer 147*b* is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the insulating layer 147*b* includes a low-k material or a porous dielectric material having a k-value which is lower than that of silicon oxide, or lower than about 3.0 or about 2.5, in accordance with some embodiments.

The thermal conductive layer 148 and the bonding pads 149 are formed over the dielectric layer 146, the conductive via structures 147*a*, and the insulating layer 147*b*, in accordance with some embodiments. The thermal conductive layer 148 surrounds the bonding pads 149, in accordance with some embodiments.

In some embodiments, a top surface 148*a* of the thermal conductive layer 148 and top surfaces 149*a* of the bonding pads 149 are substantially coplanar. The conductive via structures 147*a* are electrically connected to the corresponding bonding pads 149, in accordance with some embodiments.

The thermal conductive layer 148 has a higher thermal conductivity than the dielectric structure 143*a* or the dielectric layer 146, in accordance with some embodiments. The thermal conductive layer 148 is made of a dielectric material, in accordance with some embodiments. The dielectric material includes a nitride material such as aluminum nitride (AlN) or boron nitride (BN), a carbon-containing material such as diamond, or another suitable high thermal conductivity dielectric material with a thermal conductivity higher than that of silicon oxide, in accordance with some embodiments.

The thermal conductive layer 148 is formed using a chemical vapor deposition (CVD) process, such as a low-pressure CVD process, a plasma-enhanced CVD process, or a high-density plasma CVD process, an atomic layer deposition process, a physical vapor deposition process, or another suitable process.

The bonding pads 149 are made of a conductive material, such as metal (e.g., copper, aluminum, gold, silver, or tungsten) or alloys thereof, in accordance with some embodiments.

Figure 1E:
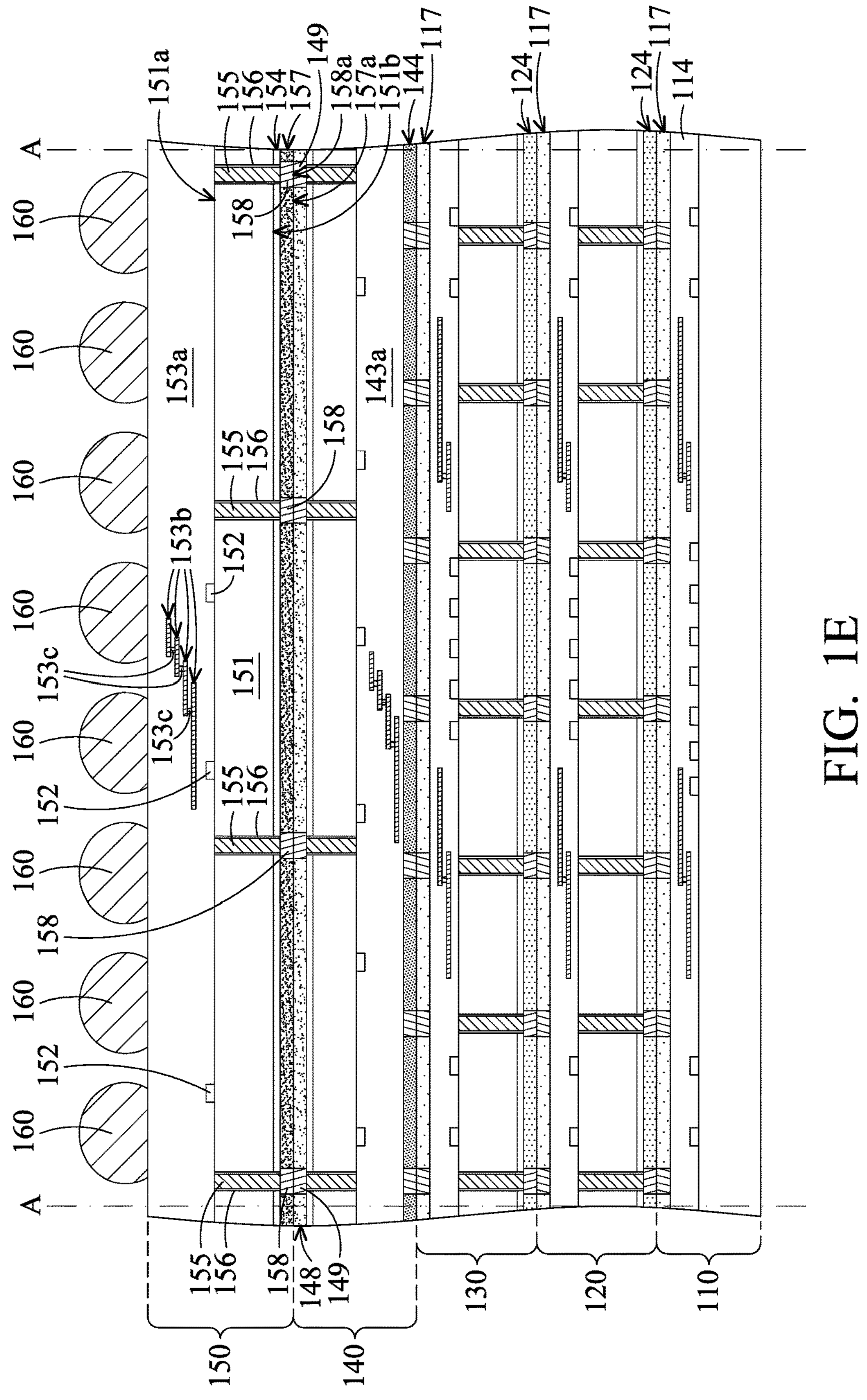

As shown in FIG. 1E, a calculating chip structure 150 is bonded to the intermediate chip structure 140, in accordance with some embodiments. The calculating chip structure 150 and the intermediate chip structure 140 are bonded back-to-back, in accordance with some embodiments. The calculating chip structure 150 is also referred to as a chip-containing structure, in accordance with some embodiments.

The calculating chip structure 150 has a substrate 151, device elements 152, a dielectric structure 153*a*, wiring layers 153*b*, conductive vias 153*c*, a dielectric layer 154, conductive via structures 155, an insulating layer 156, a thermal conductive layer 157, and bonding pads 158, in accordance with some embodiments.

The substrate 151 includes, for example, a semiconductor substrate. The substrate 151 includes, for example, a semiconductor wafer (such as a silicon wafer) or a portion of a semiconductor wafer. In some embodiments, the substrate 151 is made of an elementary semiconductor material including silicon or germanium in a single crystal structure, a polycrystal structure, or an amorphous structure.

In some other embodiments, the substrate 151 is made of a compound semiconductor, such as silicon carbide, gallium arsenide, gallium phosphide, indium phosphide, indium arsenide, an alloy semiconductor, such as SiGe or GaAsP, or a combination thereof. The substrate 151 may also include multi-layer semiconductors, semiconductor on insulator (SOI) (such as silicon on insulator or germanium on insulator), or a combination thereof.

In some embodiments, the device elements 152 are formed in and/or over the substrate 151. The device elements 152 include calculating elements, in accordance with some embodiments. The calculating elements include cache elements, in accordance with some embodiments. The calculating chip structure 150 does not have memory cells, a multiplexer, sense amplifiers (SA) and/or driver elements, in accordance with some embodiments.

In some embodiments, the device elements 152 include active devices, passive devices, other suitable elements, or a combination thereof. The active devices may include transistors or diodes (not shown) formed at a front surface 151*a* of the substrate 151. The front surface 151*a* faces away from the intermediate chip structure 140, in accordance with some embodiments. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 151. The isolation features are used to surround active regions and electrically isolate various device elements formed in and/or over the substrate 151 in the active regions. In some embodiments, the isolation features include shallow trench isolation (STI) features, local oxidation of silicon (LOCOS) features, other suitable isolation features, or a combination thereof.

The dielectric structure 153*a* is formed over the substrate 151, in accordance with some embodiments. The dielectric structure 153*a* covers the device elements 152, in accordance with some embodiments. The dielectric structure 153*a* includes dielectric layers, in accordance with some embodiments.

The wiring layers 153*b* and the conductive vias 153*c* are formed in the dielectric structure 153*a*, in accordance with some embodiments. The number of the wiring layers 153*b* ranges from about 11 to about 15, in accordance with some embodiments. The conductive vias 153*c* are electrically connected between the wiring layers 153*b* and the device elements 152, in accordance with some embodiments.

The dielectric structure 153*a* is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric structure 153*a* includes a low-k material or a porous dielectric material having a k-value which is lower than that of silicon oxide, or lower than about 3.0 or about 2.5, in accordance with some embodiments.

The dielectric structure 153*a* is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The wiring layers 153*b* and the conductive vias 153*c* are made of a conductive material, such as metal (e.g., copper, aluminum, gold, silver, or tungsten) or alloys thereof, in accordance with some embodiments.

The dielectric layer 154 is formed under a back surface 151*b* of the substrate 151, in accordance with some embodiments. The dielectric layer 154 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 154 includes a low-k material or a porous dielectric material having a k-value which is lower than that of silicon oxide, or lower than about 3.0 or about 2.5, in accordance with some embodiments.

The dielectric layer 154 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The conductive via structures 155 pass through the substrate 151 and the dielectric layer 154, in accordance with some embodiments. The insulating layer 156 is between the conductive via structures 155 and the substrate 151 and between the conductive via structures 155 and the dielectric layer 154, in accordance with some embodiments. The insulating layer 156 is used to electrically insulate (or separate) the conductive via structures 155 from the substrate 151, in accordance with some embodiments.

The insulating layer 156 continuously surrounds each conductive via structure 155, in accordance with some embodiments. The conductive via structures 155 are made of a conductive material, such as metal (e.g., copper, aluminum, gold, silver, or tungsten) or alloys thereof, in accordance with some embodiments.

The insulating layer 156 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the insulating layer 156 includes a low-k material or a porous dielectric material having a k-value which is lower than that of silicon oxide, or lower than about 3.0 or about 2.5, in accordance with some embodiments.

The thermal conductive layer 157 and the bonding pads 158 are formed under the dielectric layer 154, the conductive via structures 155, and the insulating layer 156, in accordance with some embodiments. The thermal conductive layer 157 laterally surrounds the bonding pads 158, in accordance with some embodiments.

In some embodiments, a bottom surface 157*a* of the thermal conductive layer 157 and bottom surfaces 158*a* of the bonding pads 158 are substantially coplanar. The conductive via structures 155 are electrically connected to the corresponding bonding pads 158, in accordance with some embodiments.

The calculating chip structure 150 is bonded to the intermediate chip structure 140 through dielectric-to-dielectric bonding and metal-to-metal bonding, in accordance with some embodiments. For example, the thermal conductive layer 157 is directly bonded to the thermal conductive layer 148 of the intermediate chip structure 140 while the calculating chip structure 150 is bonded to the intermediate chip structure 140, in accordance with some embodiments. The bonding pads 158 are directly bonded to the bonding pads 149 of the intermediate chip structure 140 while the calculating chip structure 150 is bonded to the intermediate chip structure 140, in accordance with some embodiments.

The thermal conductive layer 157 has a thermal conductivity higher than that of the dielectric structure 153*a* or the dielectric layer 154, in accordance with some embodiments. The thermal conductive layer 157 is made of a dielectric material, in accordance with some embodiments. The dielectric material includes a nitride material such as aluminum nitride (AlN) or boron nitride (BN), a carbon-containing material such as diamond, or another suitable high thermal conductivity dielectric material with a thermal conductivity higher than that of silicon oxide, in accordance with some embodiments.

The thermal conductive layer 117, 124, 144, 148, or 157 has a higher k-value than that of the dielectric structures 114, 143*a*, and 153*a* or silicon oxide, in accordance with some embodiments.

The thermal conductive layer 157 is formed using a chemical vapor deposition (CVD) process, such as a low-pressure CVD process, a plasma-enhanced CVD process, or a high-density plasma CVD process, an atomic layer deposition process, a physical vapor deposition process, or another suitable process.

The bonding pads 158 are made of a conductive material, such as metal (e.g., copper, aluminum, gold, silver, or tungsten) or alloys thereof, in accordance with some embodiments.

As shown in FIG. 1E, solder bumps 160 are formed over the dielectric structure 153*a*, in accordance with some embodiments. The solder bumps 160 are electrically connected to the wiring layers 153*b* and the conductive vias 153*c*, in accordance with some embodiments. The solder bumps 160 are made of a conductive material, such as a tin-based alloy, in accordance with some embodiments.

Figure 1F:
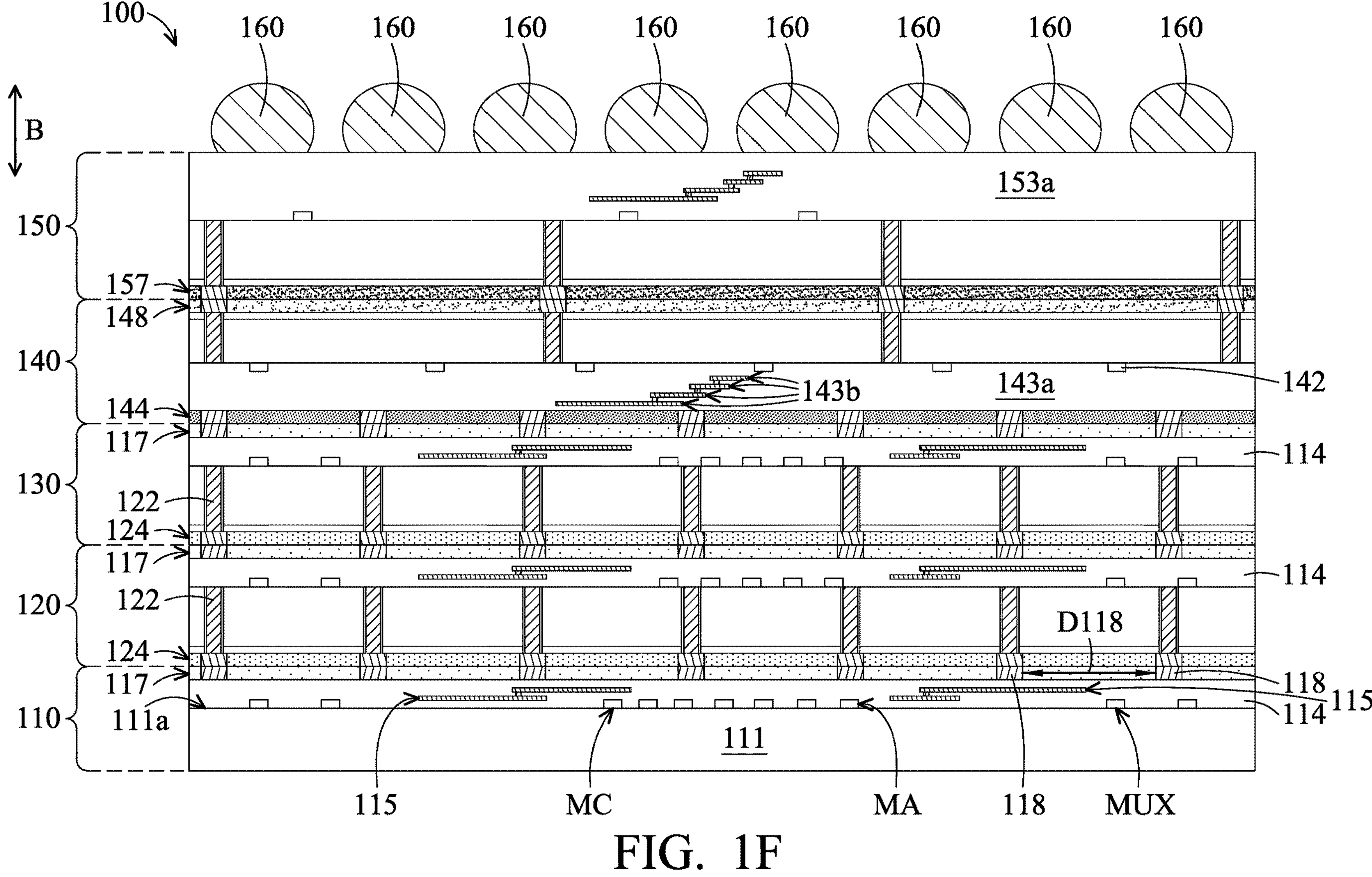

As shown in FIGS. 1E and 1F, a dicing process is performed along dicing lines A, in accordance with some embodiments. After the dicing process, package structures 100 are formed, in accordance with some embodiments. For the sake of simplicity, FIG. 1F only shows one of the package structures 100, in accordance with some embodiments.

The package structure 100 includes portions of the cell chip structures 110, 120, and 130, the intermediate chip structure 140, the calculating chip structure 150, and the solder bumps 160, in accordance with some embodiments. The calculating chip structure 150 includes a central processing unit (CPU) chip structure, in accordance with some embodiments. The cell chip structures 110, 120, and 130 and the intermediate chip structure 140 together form a static random access memory (SRAM) device, in accordance with some embodiments.

In one comparison embodiment (not shown), the memory cell array, the multiplexer, the sense amplifiers, and the driver elements are formed in the same chip structure, and the data are laterally transmitted from the memory cell array to the multiplexer and the sense amplifiers and/or the driver elements, and the length of the lateral transmission path is in the order of millimeters.

In contrast, the application forms the memory cell array MA and the multiplexer MUX in a first chip structure (i.e., the cell chip structure 110, 120 or 130) and forms the sense amplifiers and the driver elements (i.e., the device elements 142) in a second chip structure (i.e., the intermediate chip structure 140), and the first chip structure and the second chip structure are vertically stacked on each other, in accordance with some embodiments. Therefore, the data are vertically transmitted from the first chip structure to the second chip structure, and the length of the vertical transmission path ranges from about 250 μm to about 350 μm, which is much smaller than the lateral transmission path of the comparison embodiment.

As a result, the application shortens the data transmission path, which improves the efficiency of the package structure 100, in accordance with some embodiments. Furthermore, since the cell chip structure 110, 120 or 130 only has the memory cell array MA and the multiplexer MUX, the number of the wiring layers 115 is reduced, which reduces the thickness of the cell chip structures 110, 120 and 130, in accordance with some embodiments.

Similarly, since the intermediate chip structure 140 only has the sense amplifiers and the driver elements (i.e., the device elements 142), the number of the wiring layers **143*b* is reduced, which reduces the thickness of the intermediate chip structure 140, in accordance with some embodiments. Therefore, the total thickness of the cell chip structures 110, 120 and 130 and the intermediate chip structure 140** is reduced, in accordance with some embodiments.

As a result, the heat dissipation path from the calculating chip structure 150 to the cell chip structure 110, which is connected with a heat dissipation lid in a subsequent process, is shortened. Therefore, the heat dissipation efficiency of the package structure 100 is improved, in accordance with some embodiments.

Since the cell chip structure 110, 120 or 130 only has the memory cell array MA and the multiplexer MUX with a small pitch and does not have other peripheral devices (e.g., the sense amplifiers and the driver elements) with a large pitch, the distance D118 between the bonding pads 118 is less than that of the comparison embodiment, in accordance with some embodiments. Therefore, the number of the bonding pads 118 of the application is greater than that of the comparison embodiment, which improves the data transmission amount (or the bandwidth) of the package structure 100, in accordance with some embodiments.

Since the memory cells MC is formed using a more advanced technology node than the peripheral device elements (e.g., the sense amplifiers and the driver elements), the cell chip structures 110, 120 and 130 are formed independently from the intermediate chip structure 140 for individual optimization and lowering manufacturing costs, in accordance with some embodiments.

Since the package structure 100 has the thermal conductive layers 117, 124, 144, 148, and 157, the heat dissipation efficiency of the package structure 100 is improved, in accordance with some embodiments.

As shown in FIG. 1F, the conductive via structures 122 of the cell chip structures 120 and 130 are aligned with each other along an axis B, which is substantially perpendicular to the front surface **111*a* of the substrate 111, in accordance with some embodiments. Therefore, the data from the cell chip structure 110 is transmitted to the intermediate chip structure 140 through the shortest path, thereby improving the data transmission efficiency of the package structure 100**, in accordance with some embodiments.

Figure 2:
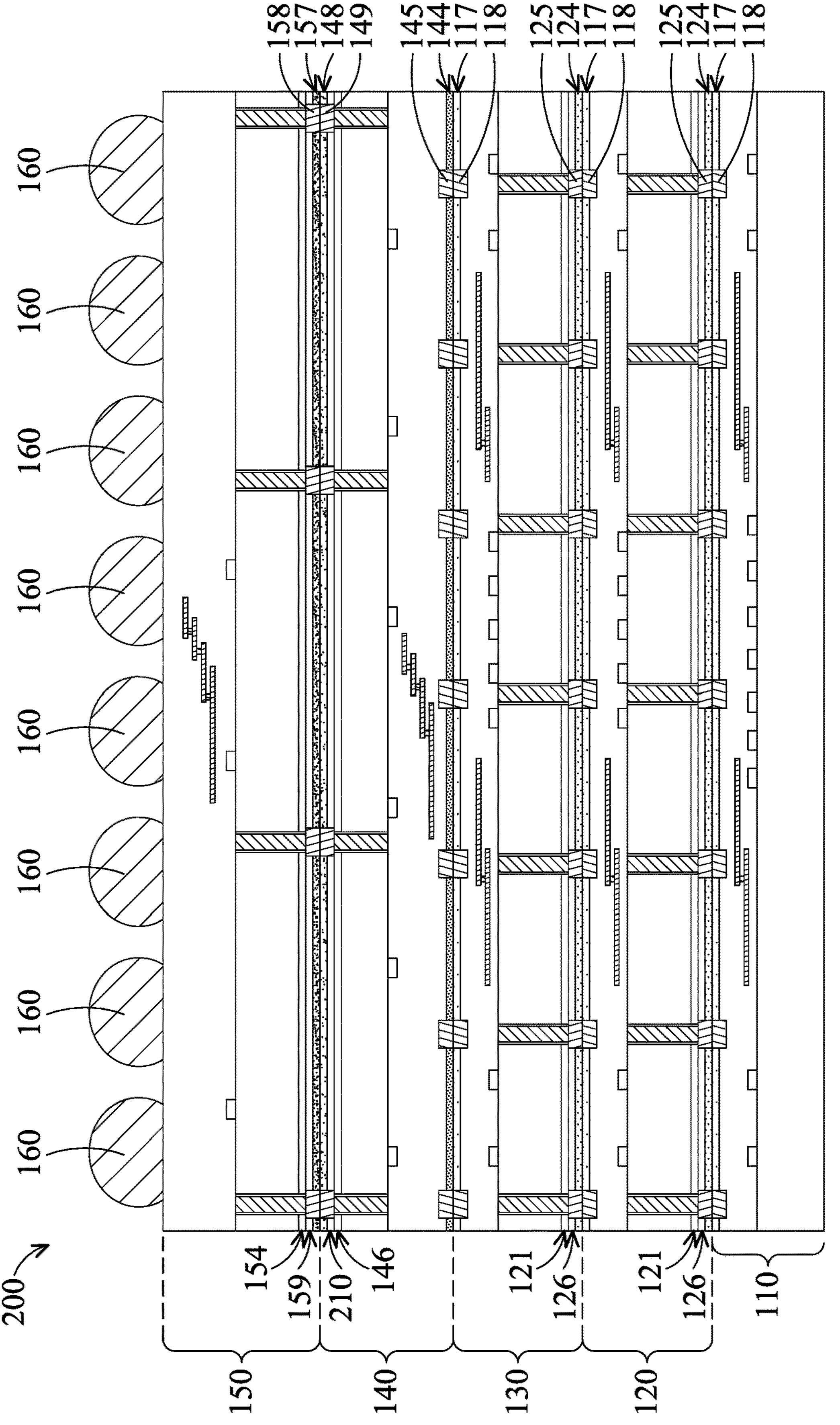
FIG. 2 is a cross-sectional view illustrating a package structure, in accordance with some embodiments.

FIG. 2 is a cross-sectional view illustrating a package structure 200, in accordance with some embodiments. As shown in FIG. 2, the package structure 200 is similar to the package structure 100 of FIG. 1F, except that the thermal conductive layer 117 of the package structure 200 is thinner than the bonding pad 118, in accordance with some embodiments.

Furthermore, the thermal conductive layer 124 is thinner than the bonding pad 125, in accordance with some embodiments. The thermal conductive layer 144 is thinner than the bonding pad 145 of the intermediate chip structure 140, in accordance with some embodiments.

The thermal conductive layer 148 is thinner than the bonding pad 149 of the intermediate chip structure 140, in accordance with some embodiments. The thermal conductive layer 157 is thinner than the bonding pad 158 of the calculating chip structure 150, in accordance with some embodiments.

The cell chip structure 120 further has a dielectric layer 126, in accordance with some embodiments. The dielectric layer 126 is between the dielectric layer 121 and the thermal conductive layer 124, in accordance with some embodiments. The dielectric layer 126 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 126 includes a low-k material or a porous dielectric material having a k-value which is lower than that of silicon oxide, or lower than about 3.0 or about 2.5, in accordance with some embodiments.

The dielectric layer 126 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The cell chip structure 130 also further has a dielectric layer 126, in accordance with some embodiments. The dielectric layer 126 is between the dielectric layer 121 and the thermal conductive layer 124, in accordance with some embodiments.

The intermediate chip structure 140 further has a dielectric layer 210, in accordance with some embodiments. The dielectric layer 210 is between the dielectric layer 146 and the thermal conductive layer 148, in accordance with some embodiments. The dielectric layer 210 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 210 includes a low-k material or a porous dielectric material having a k-value which is lower than that of silicon oxide, or lower than about 3.0 or about 2.5, in accordance with some embodiments. The dielectric layer 210 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The cell chip structure 150 further has a dielectric layer 159, in accordance with some embodiments. The dielectric layer 159 is between the dielectric layer 154 and the thermal conductive layer 157, in accordance with some embodiments. The dielectric layer 159 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 159 includes a low-k material or a porous dielectric material having a k-value which is lower than that of silicon oxide, or lower than about 3.0 or about 2.5, in accordance with some embodiments. The dielectric layer 159 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

Figure 3A:
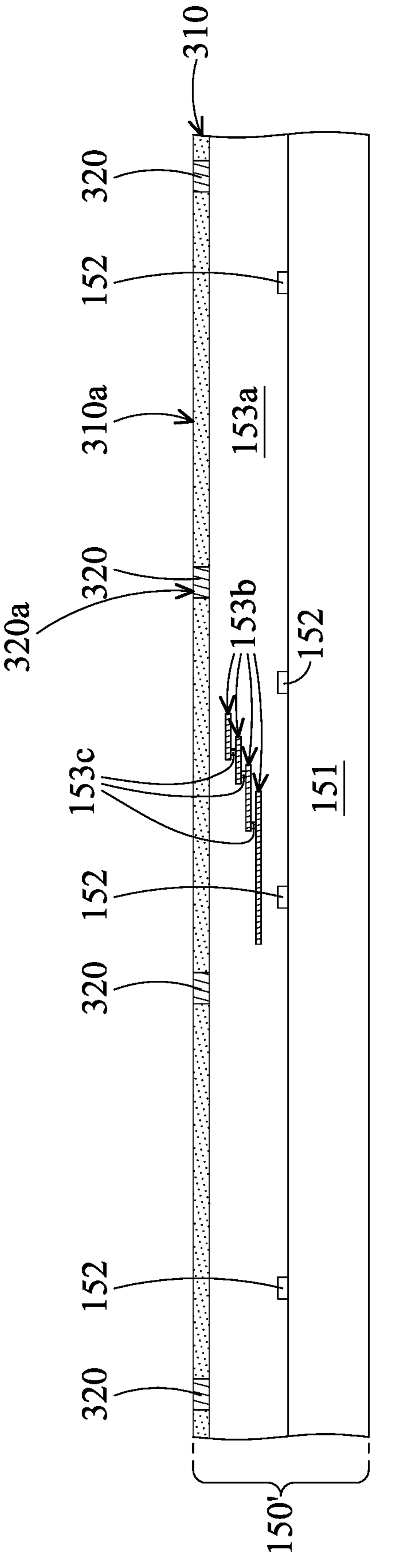
FIGS. 3A-3F are cross-sectional views of various stages of a process for forming a package structure, in accordance with some embodiments.

FIGS. 3A-3F are cross-sectional views of various stages of a process for forming a package structure, in accordance with some embodiments. As shown in FIG. 3A, a calculating chip structure 150' is provided, in accordance with some embodiments. The calculating chip structure 150' is similar to the calculating chip structure 150 of FIG. 1E, except that the calculating chip structure 150' does not have the dielectric layer 154, the conductive via structures 155, the insulating layer 156, the thermal conductive layer 157, and the bonding pads 158 of the calculating chip structure 150 of FIG. 1E, in accordance with some embodiments.

The calculating chip structure 150' further has a thermal conductive layer 310 and bonding pads 320, in accordance with some embodiments. The thermal conductive layer 310 and the bonding pads 320 are formed over the dielectric structure 153*a*, in accordance with some embodiments. The thermal conductive layer 310 surrounds the bonding pads 320, in accordance with some embodiments.

In some embodiments, a top surface 310*a* of the thermal conductive layer 310 and top surfaces 320*a* of the bonding pads 320 are substantially coplanar. The conductive vias 153*c* are electrically connected between the wiring layers 153*b*, the device elements 152, and the bonding pads 320, in accordance with some embodiments.

The thermal conductive layer 310 has a higher thermal conductivity than the dielectric structure 153*a*, in accordance with some embodiments. The thermal conductive layer 310 is made of a dielectric material, in accordance with some embodiments. The dielectric material includes a nitride material such as aluminum nitride (AlN) or boron nitride (BN), a carbon-containing material such as diamond, or another suitable high thermal conductivity dielectric material with a thermal conductivity higher than that of silicon oxide, in accordance with some embodiments.

The thermal conductive layer 310 is formed using a chemical vapor deposition (CVD) process, such as a low-pressure CVD process, a plasma-enhanced CVD process, or a high-density plasma CVD process, an atomic layer deposition process, a physical vapor deposition process, or another suitable process.

The bonding pads 320 are made of a conductive material, such as metal (e.g., copper, aluminum, gold, silver, or tungsten) or alloys thereof, in accordance with some embodiments.

Figure 3B:
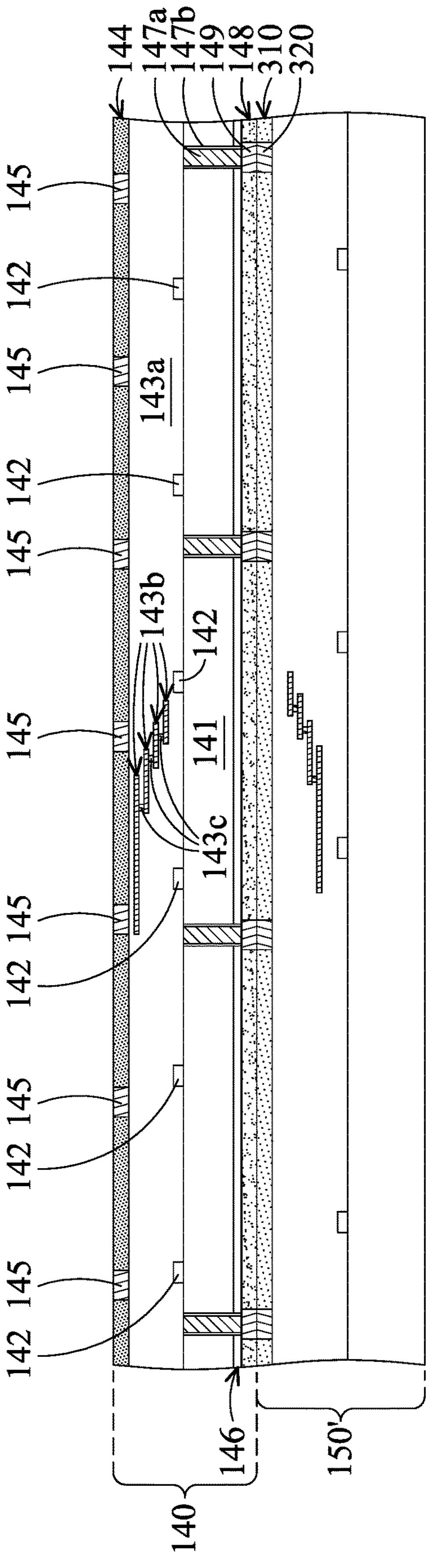

As shown in FIG. 3B, an intermediate chip structure 140 is bonded to the calculating chip structure 150', in accordance with some embodiments. The intermediate chip structure 140 is similar to or the same as the intermediate chip structure 140 of FIG. 1E, in accordance with some embodiments.

The intermediate chip structure 140 is bonded to the calculating chip structure 150' through dielectric-to-dielectric bonding and metal-to-metal bonding, in accordance with some embodiments. For example, the thermal conductive layer 148 is directly bonded to the thermal conductive layer 310 of the calculating chip structure 150' while the intermediate chip structure 140 is bonded to the calculating chip structure 150', in accordance with some embodiments. The bonding pads 149 are directly bonded to the bonding pads 320 of the calculating chip structure 150' while the intermediate chip structure 140 is bonded to the calculating chip structure 150', in accordance with some embodiments.

Figure 3C:
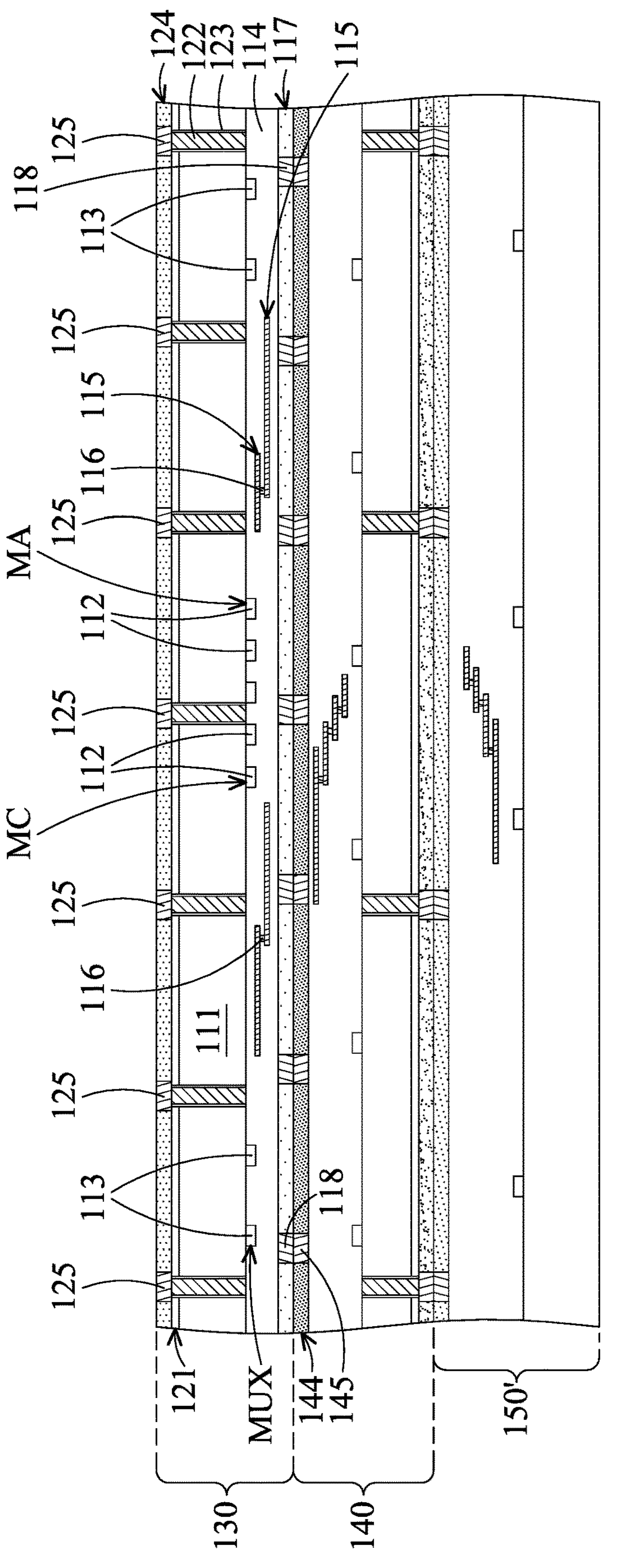

As shown in FIG. 3C, a cell chip structure 130 is provided, in accordance with some embodiments. The cell chip structure 130 is similar to or the same as the cell chip structure 130 of FIG. 1E, in accordance with some embodiments. As shown in FIG. 3C, the cell chip structure 130 is directly bonded to the intermediate chip structure 140 through dielectric-to-dielectric bonding and metal-to-metal bonding, in accordance with some embodiments.

For example, the thermal conductive layer 117 is directly bonded to the thermal conductive layer 144 of the intermediate chip structure 140 while the cell chip structure 130 is directly bonded to the intermediate chip structure 140, in accordance with some embodiments. The bonding pads 118 are directly bonded to the bonding pads 145 of the intermediate chip structure 140 while the cell chip structure 130 is directly bonded to the intermediate chip structure 140, in accordance with some embodiments.

Figure 3D:
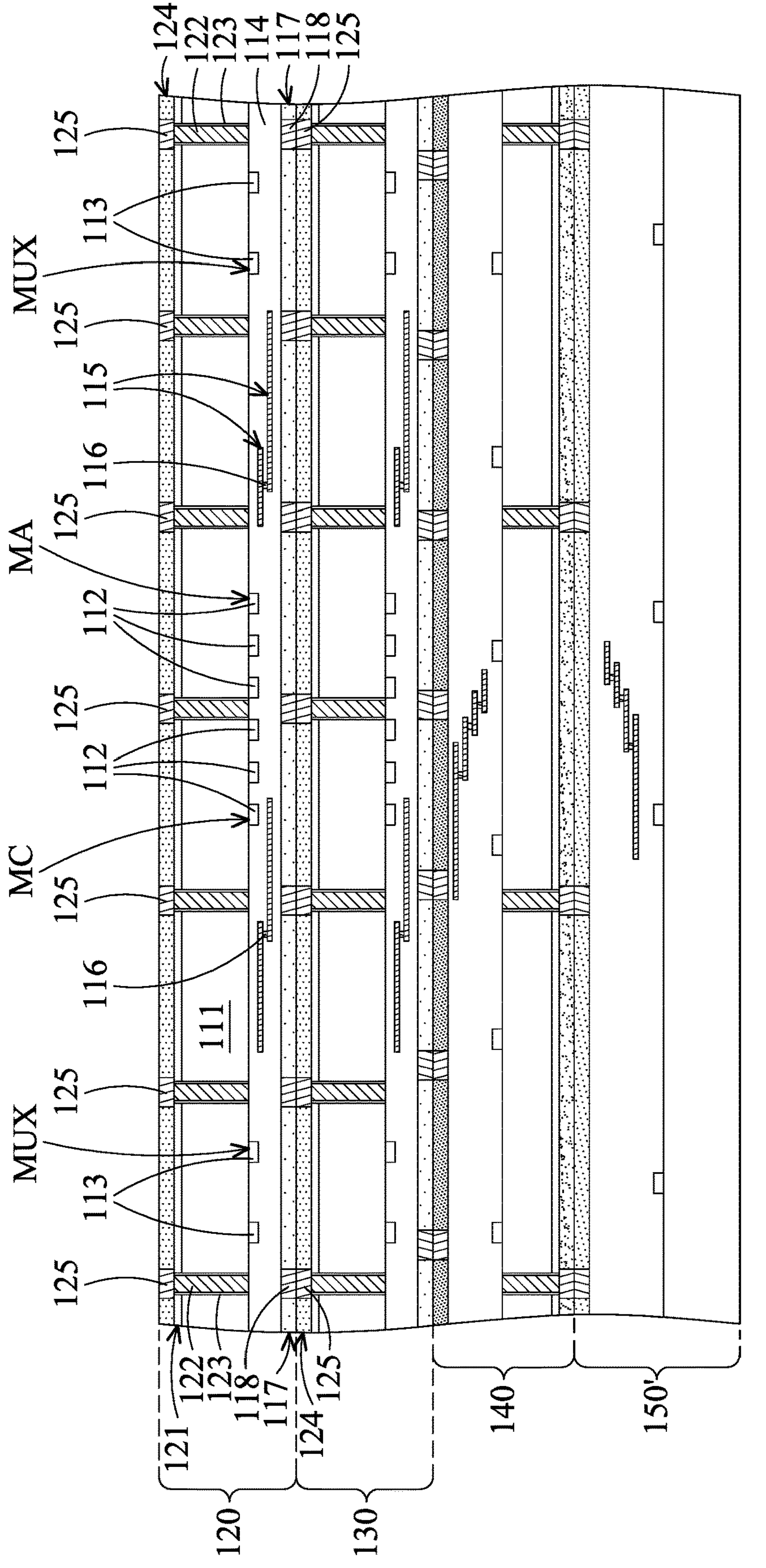

As shown in FIG. 3D, a cell chip structure 120 is provided, in accordance with some embodiments. The cell chip structure 120 is similar to or the same as the cell chip structure 120 of FIG. 1E, in accordance with some embodiments. As shown in FIG. 3D, the cell chip structure 120 is directly bonded to the cell chip structure 130 through dielectric-to-dielectric bonding and metal-to-metal bonding, in accordance with some embodiments.

For example, the thermal conductive layer 117 is directly bonded to the thermal conductive layer 124 of the cell chip structure 130 while the cell chip structure 120 is directly bonded to the cell chip structure 130, in accordance with some embodiments. The bonding pads 118 are directly bonded to the bonding pads 125 of the cell chip structure 130 while the cell chip structure 120 is directly bonded to the cell chip structure 130, in accordance with some embodiments.

Figure 3E:
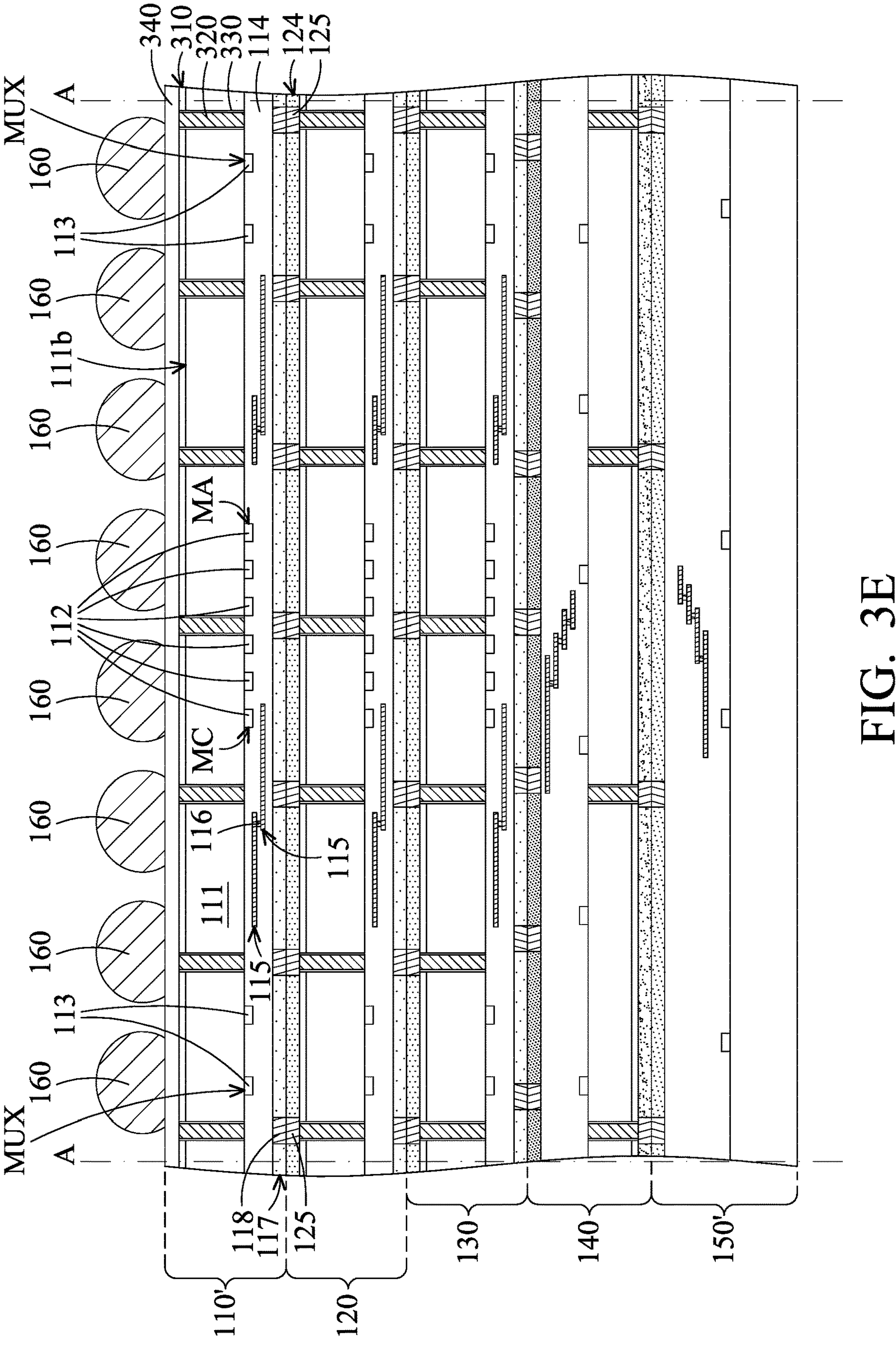

As shown in FIG. 3E, a cell chip structure 110' is provided, in accordance with some embodiments. The cell chip structure 110' is similar to the cell chip structure 110 of FIG. 1E, except that the cell chip structure 110' further has a dielectric layer 310, conductive via structures 320, an insulating layer 330, and a redistribution layer 340, in accordance with some embodiments.

The dielectric layer 310 is formed over a back surface 111*b* of the substrate 111 of the cell chip structure 110', in accordance with some embodiments. The dielectric layer 310 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric layer 310 includes a low-k material or a porous dielectric material having a k-value which is lower than that of silicon oxide, or lower than about 3.0 or about 2.5, in accordance with some embodiments.

The dielectric layer 310 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The conductive via structures 320 pass through the substrate 111 and the dielectric layer 310, in accordance with some embodiments. The insulating layer 330 is between the conductive via structures 320 and the substrate 111 and between the conductive via structures 320 and the dielectric layer 310, in accordance with some embodiments.

The insulating layer 330 is used to electrically insulate (or separate) the conductive via structures 320 from the substrate 111, in accordance with some embodiments. The insulating layer 330 continuously surrounds each conductive via structure 320, in accordance with some embodiments.

The conductive via structures 320 are made of a conductive material, such as metal (e.g., copper, aluminum, gold, silver, or tungsten) or alloys thereof, in accordance with some embodiments. The insulating layer 330 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the insulating layer 330 includes a low-k material or a porous dielectric material having a k-value which is lower than that of silicon oxide, or lower than about 3.0 or about 2.5, in accordance with some embodiments.

The redistribution layer 340 includes a dielectric structure (not shown), wiring layers (not shown), and conductive vias (not shown), in accordance with some embodiments. The wiring layers and the conductive vias are in the dielectric structure, in accordance with some embodiments. The conductive vias are electrically connected between the wiring layers and the conductive via structures 320, in accordance with some embodiments.

The dielectric structure is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric structure includes a low-k material or a porous dielectric material having a k-value which is lower than that of silicon oxide, or lower than about 3.0 or about 2.5, in accordance with some embodiments. The wiring layers and the conductive vias are made of a conductive material, such as metal (e.g., copper, aluminum, gold, silver, or tungsten) or alloys thereof, in accordance with some embodiments.

Figure 3F:
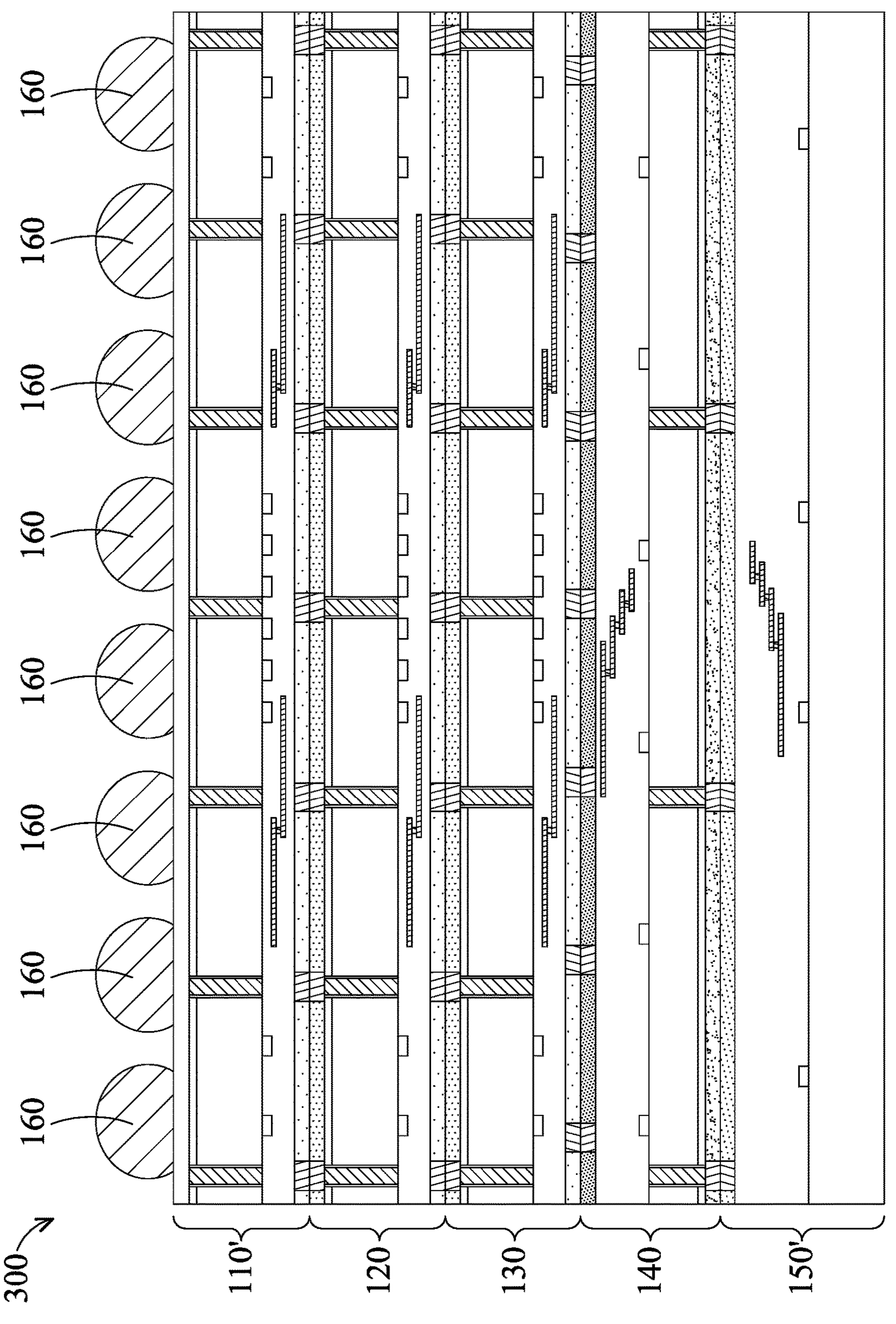

As shown in FIGS. 3E and 3F, a dicing process is performed along dicing lines A, in accordance with some embodiments. After the dicing process, package structures 300 are formed, in accordance with some embodiments. For the sake of simplicity, FIG. 3F only shows one of the package structures 300, in accordance with some embodiments.

The package structure 300 includes portions of the cell chip structures 110', 120, and 130, the intermediate chip structure 140, the calculating chip structure 150', and the solder bumps 160, in accordance with some embodiments.

Figure 4:
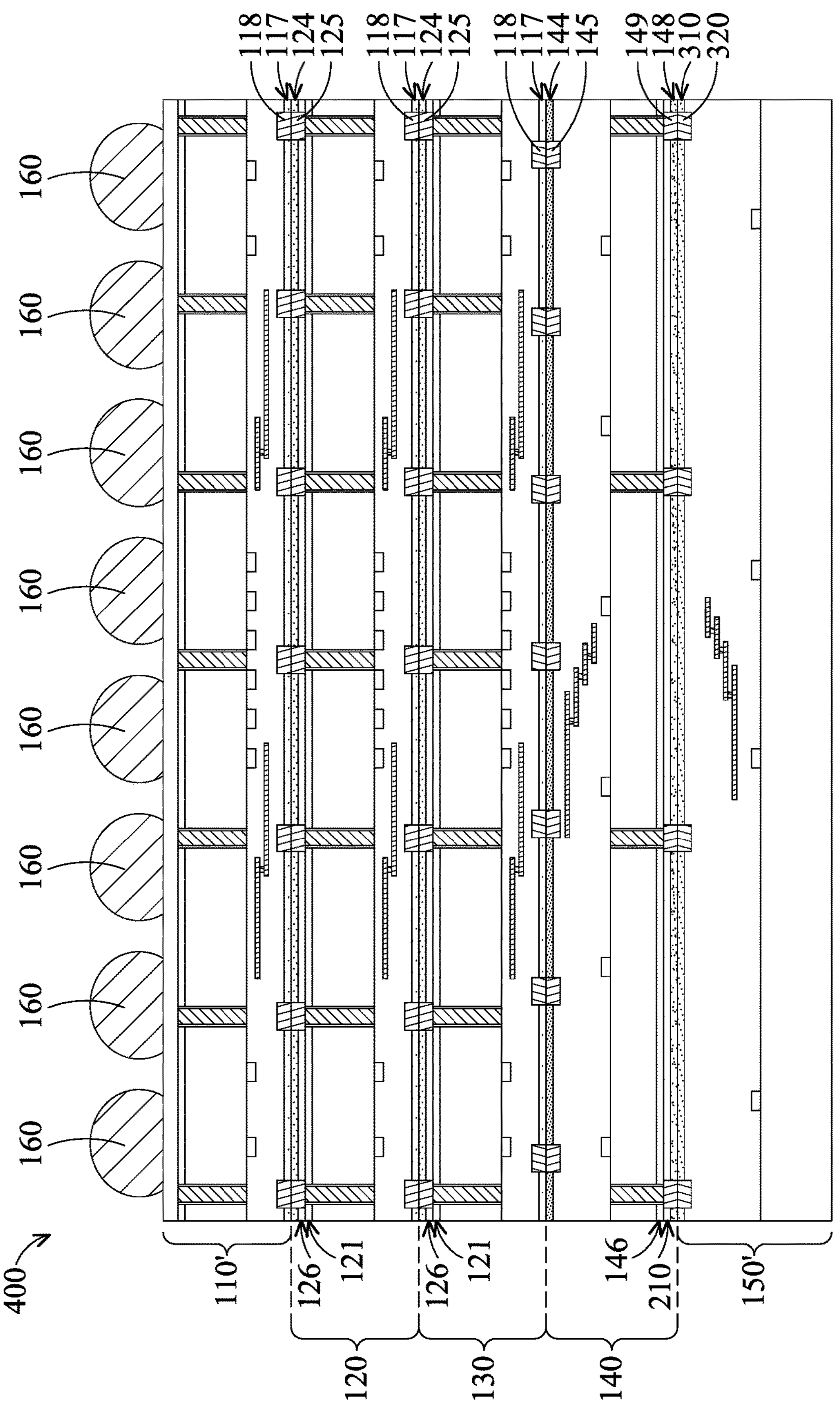
FIG. 4 is a cross-sectional view illustrating a package structure, in accordance with some embodiments.

FIG. 4 is a cross-sectional view illustrating a package structure 400, in accordance with some embodiments. As shown in FIG. 4, the package structure 400 is similar to the package structure 300 of FIG. 3F, except that the thermal conductive layer 117 of the package structure 400 is thinner than the bonding pad 118, in accordance with some embodiments.

Furthermore, the thermal conductive layer 124 is thinner than the bonding pad 125, in accordance with some embodiments. The thermal conductive layer 144 is thinner than the bonding pad 145 of the intermediate chip structure 140, in accordance with some embodiments.

The thermal conductive layer 148 is thinner than the bonding pad 149 of the intermediate chip structure 140, in accordance with some embodiments. The thermal conductive layer 310 is thinner than the bonding pad 320 of the calculating chip structure 150', in accordance with some embodiments.

The cell chip structure 120 further has a dielectric layer 126, in accordance with some embodiments. The dielectric layer 126 is between the dielectric layer 121 and the thermal conductive layer 124, in accordance with some embodiments. The dielectric layer 126 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 126 includes a low-k material or a porous dielectric material having a k-value which is lower than that of silicon oxide, or lower than about 3.0 or about 2.5, in accordance with some embodiments.

The dielectric layer 126 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The cell chip structure 130 also further has a dielectric layer 126, in accordance with some embodiments. The dielectric layer 126 is between the dielectric layer 121 and the thermal conductive layer 124, in accordance with some embodiments.

The intermediate chip structure 140 further has a dielectric layer 210, in accordance with some embodiments. The dielectric layer 210 is between the dielectric layer 146 and the thermal conductive layer 148, in accordance with some embodiments. The dielectric layer 210 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 210 includes a low-k material or a porous dielectric material having a k-value which is lower than that of silicon oxide, or lower than about 3.0 or about 2.5, in accordance with some embodiments. The dielectric layer 210 is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

Figure 5:
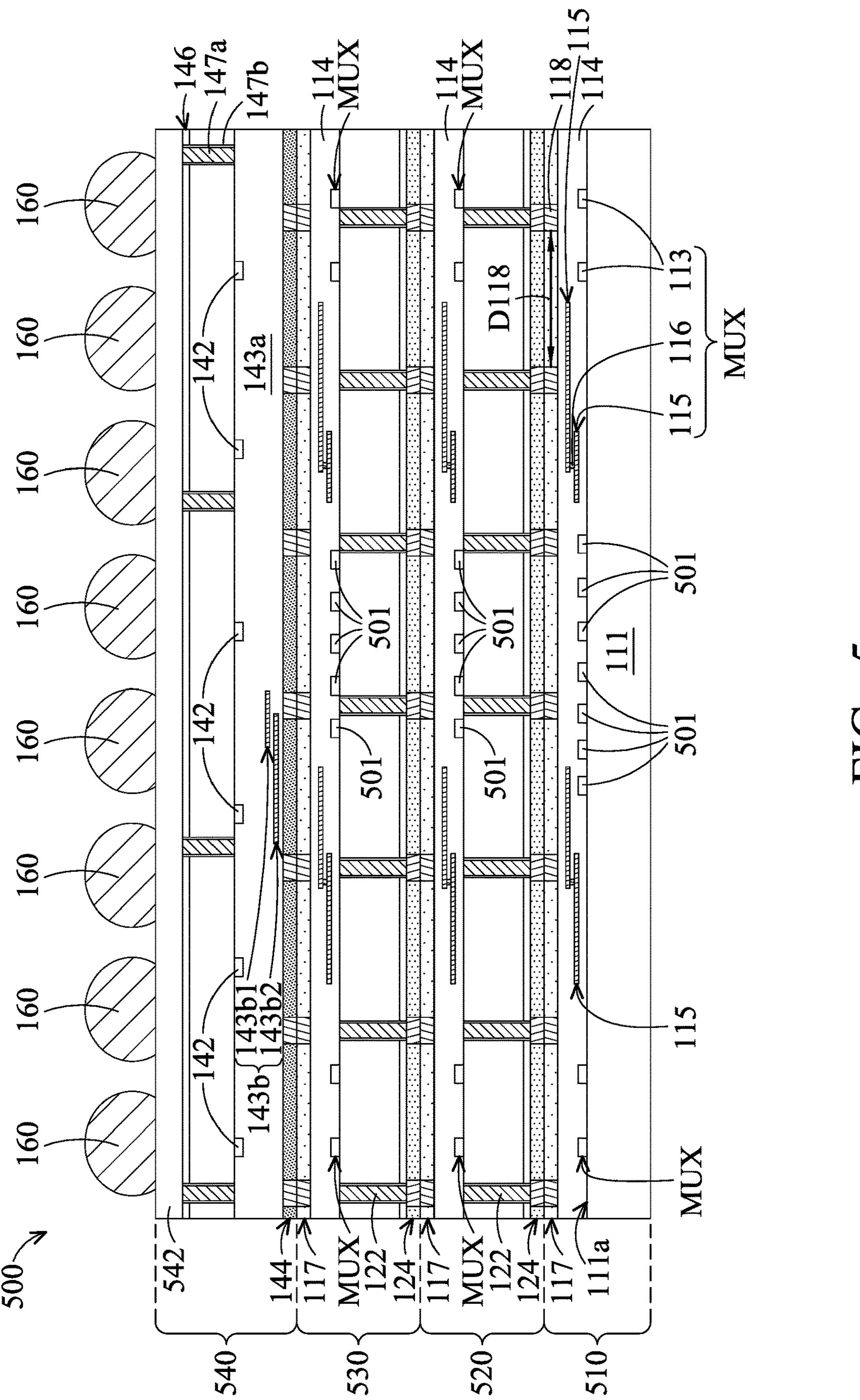
FIG. 5 is a cross-sectional view illustrating a package structure, in accordance with some embodiments.

FIG. 5 is a cross-sectional view illustrating a package structure 500, in accordance with some embodiments. As shown in FIG. 5, the package structure 500 is similar to the package structure 100 of FIG. 1F, except that the package structure 500 does not have the calculating chip structure 150 of the package structure 100, and the cell chip structures 110, 120, and 130 and the intermediate chip structure 140 of the package structure 100 are replaced with processing chips 510, 520, 530, and 540 respectively, in accordance with some embodiments.

The processing chips 510, 520, and 530 are similar to the cell chip structures 110, 120, and 130 of the package structure 100 respectively, except that the device elements 112 of the cell chip structures 110, 120, and 130 are replaced with device elements 501, in accordance with some embodiments. The device elements 501 includes logic device elements such as transistors with logic gates such as AND, OR, XOR, NOT, NAND, NOR, and XNOR gates, in accordance with some embodiments.

The processing chip 540 is similar to the intermediate chip structure 140 of the package structure 100, except that the thermal conductive layer 148 and the bonding pads 149 of the package structure 100 are replaced with a redistribution layer 542, in accordance with some embodiments. The solder bumps 160 are formed over the redistribution layer 542, in accordance with some embodiments.

The redistribution layer 542 includes a dielectric structure (not shown), wiring layers (not shown), and conductive vias (not shown), in accordance with some embodiments. The wiring layers and the conductive vias are in the dielectric structure, in accordance with some embodiments.

The conductive vias are electrically connected between the wiring layers and the conductive via structures 147*a*, in accordance with some embodiments. The solder bumps 160 are electrically connected to the conductive via structures 147*a* through the wiring layers and the conductive vias of the redistribution layer 542, in accordance with some embodiments.

The dielectric structure is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric structure includes a low-k material or a porous dielectric material having a k-value which is lower than that of silicon oxide, or lower than about 3.0 or about 2.5, in accordance with some embodiments. The wiring layers and the conductive vias are made of a conductive material, such as metal (e.g., copper, aluminum, gold, silver, or tungsten) or alloys thereof, in accordance with some embodiments.

The device elements 142 include sense amplifiers (SA), cache elements, and/or driver elements, in accordance with some embodiments. The driver elements include word line drivers, in accordance with some embodiments.

The wiring layers 143*b* of the processing chip 540 include wiring layers 143*b*1 and 143*b*2, in accordance with some embodiments. The wiring layer 143*b*1 includes conductive lines electrically connected to the logic gates of the device elements 501 of the processing chips 510, 520, and 530, and the conductive lines are similar to word lines, in accordance with some embodiments.

The wiring layer 143*b*2 includes conductive lines electrically connected to the drain electrodes of the device elements 501 of the processing chips 510, 520, and 530, and the conductive lines are similar to bit lines, in accordance with some embodiments.

The processing chip 540 does not have logic device elements such as transistors with logic gates such as AND, OR, XOR, NOT, NAND, NOR, and XNOR gates, in accordance with some embodiments. The processing chips 510, 520, and 530 do not have the sense amplifiers, the cache elements, the driver elements, and the conductive lines similar to word lines and bit lines, in accordance with some embodiments.

The package structure 500 is a XPU package structure such as an accelerated processing unit (APU) package structure, a central processing unit (CPU) package structure, a graphic processing unit (GPU), or the like.

Figure 6:
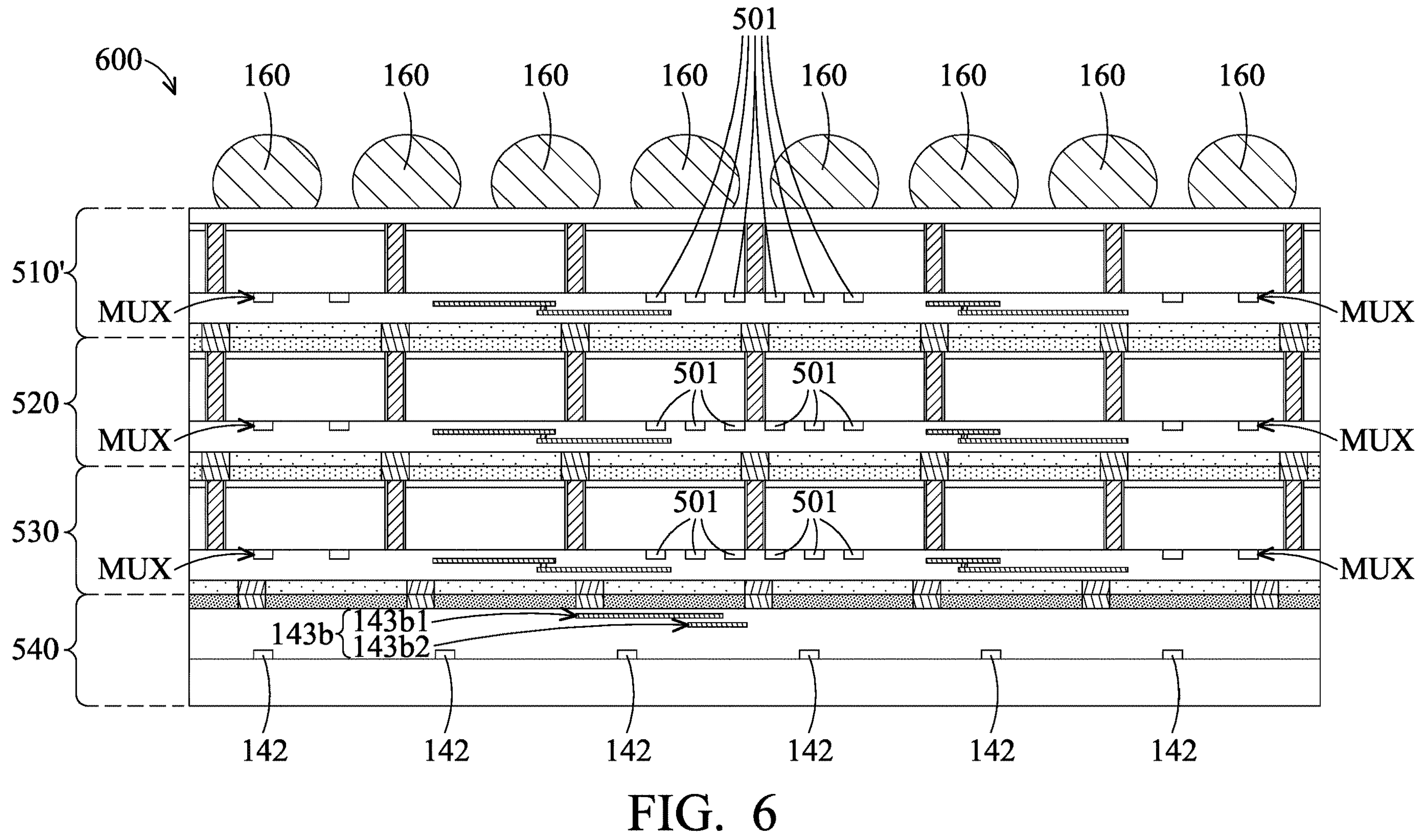
FIG. 6 is a cross-sectional view illustrating a package structure, in accordance with some embodiments.

FIG. 6 is a cross-sectional view illustrating a package structure 600, in accordance with some embodiments. As shown in FIG. 6, the package structure 600 is similar to the package structure 300 of FIG. 3F, except that the package structure 600 does not have the calculating chip structure 150' of the package structure 300, and the cell chip structures 110', 120, and 130 and the intermediate chip structure 140 of the package structure 300 are replaced with processing chips 510', 520, 530, and 540 respectively, in accordance with some embodiments.

The processing chips 510', 520, and 530 are similar to the cell chip structures 110', 120, and 130 of the package structure 300 respectively, except that the device elements 112 of the cell chip structures 110', 120, and 130 are replaced with device elements 501, in accordance with some embodiments. The device elements 501 includes logic device elements such as transistors with logic gates such as AND, OR, XOR, NOT, NAND, NOR, and XNOR gates, in accordance with some embodiments.

The processing chip 540 is similar to the intermediate chip structure 140 of the package structure 300, except that the processing chip 540 does not have the dielectric layer 146, the conductive via structures 147*a*, the insulating layer 147*b*, the thermal conductive layer 148, and the bonding pads 149 of the intermediate chip structure 140 of the package structure 300, in accordance with some embodiments.

The device elements 142 include sense amplifiers (SA), cache elements, and/or driver elements, in accordance with some embodiments. The driver elements include word line drivers, in accordance with some embodiments.

The wiring layers 143*b* of the processing chip 540 include wiring layers 143*b*1 and 143*b*2, in accordance with some embodiments. The wiring layer **143*b*1 includes conductive lines electrically connected to the logic gates of the device elements 501 of the processing chips 510', 520, and 530**, and the conductive lines are similar to word lines, in accordance with some embodiments.

The wiring layer **143*b*2 includes conductive lines electrically connected to the drain electrodes of the device elements 501 of the processing chips 510', 520, and 530**, and the conductive lines are similar to bit lines, in accordance with some embodiments.

The processing chip 540 does not have logic device elements such as transistors with logic gates such as AND, OR, XOR, NOT, NAND, NOR, and XNOR gates, in accordance with some embodiments. The processing chips 510', 520, and 530 do not have the sense amplifiers, the cache elements, the driver elements, and the conductive lines similar to word lines and bit lines, in accordance with some embodiments.

The package structure 600 is a XPU package structure such as an accelerated processing unit (APU) package structure, a central processing unit (CPU) package structure, a graphic processing unit (GPU), or the like.

Processes and materials for forming the package structures 200, 300, 400, 500 and 600 may be similar to, or the same as, those for forming the package structure 100 described above. Elements designated by the same reference numbers as those in FIGS. 1A to 6 have structures and materials that are the same or similar. Therefore, the detailed descriptions thereof will not be repeated herein.

In accordance with some embodiments, package structures and methods for forming the same are provided. The methods (for forming the package structure) form a memory cell array and a multiplexer in a first chip structure and forms sense amplifiers and driver elements in a second chip structure, and the first chip structure and the second chip structure are vertically stacked on each other. Therefore, the data are vertically transmitted from the first chip structure to the second chip structure, and the transmission path is shortened. As a result, the efficiency of the package structure is improved.

In accordance with some embodiments, a package structure is provided. The package structure includes a cell chip structure having a memory cell and a multiplexer. The package structure includes an intermediate chip structure directly bonded to the cell chip structure through dielectric-to-dielectric bonding and metal-to-metal bonding and having a sense amplifier and a driver element. The intermediate chip structure does not have a memory cell. The package structure includes a calculating chip structure bonded to the intermediate chip structure and having a calculating element.

In accordance with some embodiments, a package structure is provided. The package structure includes an intermediate chip structure having a sense amplifier and a driver element and not having a memory cell. The package structure includes a cell chip structure directly bonded to the intermediate chip structure through dielectric-to-dielectric bonding and metal-to-metal bonding. The cell chip structure has a memory cell, a multiplexer, a first bonding pad, a first dielectric structure, and a first thermal conductive layer under the first dielectric structure, the first dielectric structure covers the memory cell and the multiplexer, the first thermal conductive layer surrounds the first bonding pad, and the first thermal conductive layer has a higher thermal conductivity than the first dielectric structure.

In accordance with some embodiments, a method for forming a package structure is provided. The method includes providing a cell chip structure having a memory cell and a multiplexer. The method includes bonding an intermediate chip structure to the cell chip structure through dielectric-to-dielectric bonding and metal-to-metal bonding. The intermediate chip structure has a sense amplifier and a driver element and does not have a memory cell. The method includes bonding a calculating chip structure to the intermediate chip structure. The calculating chip structure has a calculating element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a cell chip structure having a memory cell and a multiplexer;

an intermediate chip structure directly bonded to the cell chip structure through dielectric-to-dielectric bonding and metal-to-metal bonding and having a sense amplifier and a driver element, wherein the intermediate chip structure does not have a memory cell; and a calculating chip structure bonded to the intermediate chip structure and having a calculating element.

2. The package structure as claimed in claim 1, wherein the cell chip structure has a first substrate having a first front surface facing the intermediate chip structure, the memory cell and the multiplexer are formed at the first front surface, the intermediate chip structure has a second substrate having a second front surface facing the cell chip structure, and the sense amplifier and the driver element are formed at the second front surface.

3. The package structure as claimed in claim 2, wherein the cell chip structure has a first bonding pad over the first front surface, the intermediate chip structure has a second bonding pad under the second front surface, and the first bonding pad is directly bonded to the second bonding pad.

4. The package structure as claimed in claim 3, wherein the cell chip structure further has a first dielectric structure and a first thermal conductive layer over the first dielectric structure, the first dielectric structure covers the memory cell and the multiplexer, the first thermal conductive layer laterally surrounds the first bonding pad, the first thermal conductive layer is made of a first dielectric material, and the first thermal conductive layer has a thermal conductivity higher than that of the first dielectric structure.

5. The package structure as claimed in claim 4, wherein the intermediate chip structure further has a second dielectric structure and a second thermal conductive layer under the second dielectric structure, the second dielectric structure covers the sense amplifier and the driver element, the second thermal conductive layer surrounds the second bonding pad, the second thermal conductive layer has a thermal conductivity higher than that of the second dielectric structure, the second thermal conductive layer is made of a second dielectric material, and the first thermal conductive layer is directly bonded to the second thermal conductive layer.

6. The package structure as claimed in claim 1, wherein the calculating chip structure has a substrate having a front surface facing away from the intermediate chip structure, and the calculating element is formed at the front surface.

7. The package structure as claimed in claim 6, wherein the calculating chip structure is bonded to the intermediate chip structure through dielectric-to-dielectric bonding and metal-to-metal bonding.

8. A package structure, comprising:

an intermediate chip structure having a sense amplifier and a driver element and not having a memory cell; and a cell chip structure directly bonded to the intermediate chip structure through dielectric-to-dielectric bonding and metal-to-metal bonding, wherein the cell chip structure has a memory cell, a multiplexer, a first bonding pad, a first dielectric structure including a first dielectric material, and a first thermal conductive layer under the first dielectric structure, the first dielectric structure covers the memory cell and the multiplexer, the first thermal conductive layer surrounds the first bonding pad, the first thermal conductive layer is made of a second dielectric material, and the first thermal conductive layer has a thermal conductivity higher than that of the first dielectric structure.

9. The package structure as claimed in claim 8, wherein the intermediate chip structure further has a second dielectric structure and a second thermal conductive layer over the second dielectric structure, the second dielectric structure covers the sense amplifier and the driver element, the second thermal conductive layer is made of a third dielectric material, and the second thermal conductive layer has a thermal conductivity higher than that of the second dielectric structure.

10. The package structure as claimed in claim 9, wherein the first thermal conductive layer is directly bonded to the second thermal conductive layer.

11. The package structure as claimed in claim 8, further comprising:

a calculating chip structure under the intermediate chip structure and having a calculating element.

12. The package structure as claimed in claim 11, wherein the calculating chip structure further has a second dielectric structure and a second thermal conductive layer over the second dielectric structure, the second dielectric structure covers the calculating element, and the second thermal conductive layer has a thermal conductivity higher than that of the second dielectric structure.

13. The package structure as claimed in claim 8, wherein the first thermal conductive layer is thinner than the first bonding pad.

14. A method for forming a package structure, comprising:

providing a cell chip structure having a memory cell and a multiplexer;

bonding an intermediate chip structure to the cell chip structure through dielectric-to-dielectric bonding and metal-to-metal bonding, wherein the intermediate chip structure has a sense amplifier and a driver element and does not have a memory cell; and bonding a calculating chip structure to the intermediate chip structure, wherein the calculating chip structure has a calculating element.

15. The method for forming the package structure as claimed in claim 14, wherein the cell chip structure further has a first substrate, the intermediate chip structure further has a second substrate, and the memory cell, the multiplexer, the sense amplifier, and the driver element are between the first substrate and the second substrate.

16. The method for forming the package structure as claimed in claim 14, wherein the calculating chip structure further has a substrate between the intermediate chip structure and the calculating element.

17. The method for forming the package structure as claimed in claim 14, wherein the cell chip structure further has a first dielectric structure and a first thermal conductive layer, the first dielectric structure covers the memory cell and the multiplexer, the first thermal conductive layer is formed over the first dielectric structure, the first thermal conductive layer is made of a first dielectric material, and the first thermal conductive layer has a thermal conductivity higher than that of the first dielectric structure.

18. The method for forming the package structure as claimed in claim 17, wherein the intermediate chip structure further has a second dielectric structure and a second thermal conductive layer, the second dielectric structure covers the sense amplifier and the driver element, the second thermal conductive layer is under the second dielectric structure, the second thermal conductive layer has a thermal conductivity higher than that of the second dielectric structure, the second thermal conductive layer is made of a second dielectric material, and the second thermal conductive layer is directly bonded to the first thermal conductive layer while the intermediate chip structure is bonded to the cell chip structure.

19. The method for forming the package structure as claimed in claim 18, wherein the intermediate chip structure further has a substrate and a third thermal conductive layer, the substrate is between the second thermal conductive layer and the third thermal conductive layer, the third thermal conductive layer is made of a third dielectric material, and the third thermal conductive layer has a thermal conductivity higher than that of the second dielectric structure.

20. The method for forming the package structure as claimed in claim 19, wherein the calculating chip structure further has a fourth thermal conductive layer, the fourth thermal conductive layer is made of a fourth dielectric material, and the fourth thermal conductive layer is directly bonded to the third thermal conductive layer.

* * * * *